(12) United States Patent
Kim et al.

(10) Patent No.: US 7,948,043 B2
(45) Date of Patent: May 24, 2011

(54) MEMS PACKAGE THAT INCLUDES MEMS DEVICE WAFER BONDED TO CAP WAFER AND EXPOSED ARRAY PADS

(75) Inventors: Dong-Joon Kim, Chungcheongbuk-do (KR); Sung-Gyu Pyo, Chungcheongbuk-do (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 0 days.

(21) Appl. No.: 12/564,139

(22) Filed: Sep. 22, 2009

(65) Prior Publication Data

US 2010/0006959 A1    Jan. 14, 2010

Related U.S. Application Data

(62) Division of application No. 11/808,876, filed on Jun. 13, 2007, now Pat. No. 7,615,394.

(30) Foreign Application Priority Data

Jun. 14, 2006   (KR) .............................. 2006-0053623

(51) Int. Cl.
*H01L 29/84* (2006.01)

(52) U.S. Cl. .. 257/415; 257/704; 257/779; 257/E29.324
(58) Field of Classification Search ..................... 438/51
See application file for complete search history.

(56) References Cited

U.S. PATENT DOCUMENTS

| | | |
|---|---|---|
| 2003/0087469 A1 | 5/2003 | Ma |
| 2005/0062120 A1 | 3/2005 | Ma et al. |
| 2006/0208326 A1 | 9/2006 | Nasiri et al. |
| 2007/0114643 A1* | 5/2007 | DCamp et al. ................ 257/678 |
| 2007/0128828 A1 | 6/2007 | Chen et al. |
| 2007/0269934 A1 | 11/2007 | Thompson et al. |
| 2008/0169521 A1 | 7/2008 | Foster et al. |
| 2008/0272446 A1 | 11/2008 | Haluzak et al. |

FOREIGN PATENT DOCUMENTS

JP            2005-66727         3/2005

* cited by examiner

*Primary Examiner* — Stephen W Smoot
(74) *Attorney, Agent, or Firm* — Morgan, Lewis & Bockius LLP

(57) ABSTRACT

A package of a micro-electro-mechanical systems (MEMS) device includes a cap wafer, a plurality of bonding bumps formed over the cap wafer, a plurality of array pads arrayed on an outer side of the bonding bumps, and an MEMS device wafer bonded to an upper portion of the cap wafer in a manner to expose the array pads.

17 Claims, 22 Drawing Sheets

MEMS PACKAGE THAT INCLUDES MEMS DEVICE WAFER BONDED TO CAP WAFER AND EXPOSED ARRAY PADS

CROSS-REFERENCE TO RELATED APPLICATIONS

The present invention is a divisional of U.S. patent application Ser. No. 11/808,876, filed Jun. 13, 2007, now U.S Pat. No. 7,615,394, issued Nov. 10, 2009, and also claims priority to Korean Patent Application No. 10-2006-0053623, filed on Jun. 14, 2006, both of which are hereby incorporated by reference.

BACKGROUND OF THE INVENTION

The present invention relates to a semiconductor chip package, and more particularly, to a package of a micro-electro-mechanical systems (MEMS) device and a method for fabricating the same.

In general, MEMS technology is the integration of very small mechanical devices installed inside a semiconductor chip such as sensors, valves, gears, reflecting mirrors, and drivers on a computer. Thus, MEMS are often called intelligent machines. MEMS usually comprise micro-circuits integrated on very small silicon chips installed with very small mechanical devices such as reflecting mirrors and sensors.

MEMS technology recently receives great attention because MEMS technology allows manufacturing of electronic parts using micro-electronic technology under the same cost-effectiveness. Also, MEMS technology becomes the basis of a next generation integration technology, and is considered critical to provide a ubiquitous environment. For this reason, the Korean government set the 'IT839' policy based mainly on the MEMS technology. According to the MEMS technology, instead of fabricating micro-actuators and sensors one by one for each time, several hundreds of micro-actuators and sensors can be simultaneously fabricated on a silicon wafer. The known silicon chip fabrication technology can be directly applied to the MEMS technology. Thus, a numerous number of MEMS devices can be fabricated on a silicon wafer directly using the known semiconductor fabrication processes.

As MEMS technology has been progressively improved, product classes are standardized. Thus, for fabrication processes, product designers can also focus on the design rule, which is based on methods generally used in most of the electronic products.

However, a packaging cost of MEMS devices (e.g., sensors) reaches about 30% to 70% of the total cost. This high cost may impede the commercialization of MEMS unless high-performance and low-cost packaging be achieved. In an attempt to reduce the packaging cost for sensors and others, wafer level chip scale packaging (WLCSP) that allows the implementation of mass-production processes is being vigorously applied. The WLCSP is often considered as one of the critical processes not only in the MEMS technology but also in the typical system in package (SiP) technology. The implementation the WLCSP technology requires developing bonding technology.

Bonding technology which has been currently implemented will be described hereinafter.

First, an anodic bonding method bonds glass (e.g., Pyrex) on a silicon wafer. When a voltage is applied to both ends of the glass at an ascending temperature, a $Na_2O$ component inside the glass is ionized, so that positive ions of $Na^+$ are moved to a negative pole, and negative ions of $O_2^-$ form a layer of charge on the side of a positive pole. Strong electrostatic power is generated between the charge layer of the negative ions and an electrode of aluminum (Al), and a strong bonding is created between the glass and the silicon wafer due to an interfacial chemical reaction. In a wafer level process, while a voltage of 300 V to 1000 V is applied at a temperature of 300° C. to 500° C., the glass is heated and cooled repeatedly for about 3 minutes to 10 minutes so as to create the bonding. At this time, a bonding force is not required greatly.

The above described bonding method is not sensitive to surface roughness, wafer bowing, and particles, and can simply create the bonding in a clean environment because a medium material or a buffer layer is not interposed between the substrate and the target (e.g., glass). Also, the bonding is possible under the condition of applying a voltage less than 1,000 V and a temperature below 400° C. The bonding can also occur between various materials such as metal and glass, glass and glass, and silicon and glass. Moreover, since glass is used as a packaging material, the inside of externally fabricated devices and operation thereof can be visually observed. Since the inside of the devices bonded together is usually hermetic to a vacuum (i.e., airtight characteristic), the bonding method can be applied to a packaging of various vacuum devices. The bonding method can also be implemented to form multiple-layer structures. Thus, the bonding method can be applied to fabricate various three dimensional MEMS. In other words, the bonding method has a wide range of applications. In particular, this type of packaging is biologically compatible, and thus, it can be applied to sensors for medical purposes.

However, this bonding method may have poor compatibility with complementary metal-oxide semiconductor (CMOS) devices because of accumulated alkali ions. Particularly, glass that is applied for the bonding includes sodium (Na), which is one incompatible component in semiconductor fabrication processes, the bonding method may not be applied to the whole semiconductor fabrication process. While the fabrication processes proceed, $O_2$ is likely to be desorbed. As a result, the inner pressure of cavities tends to increase.

According to a fusion bonding method or a silicon direct bonding (SDB) method, two silicon wafers to be bonded together are aligned with each other, and a mechanical spacer is interposed between the two silicon wafers. When the pressure is applied to the resultant structure, the silicon wafers start bonding together from a central portion. In the fusion bonding method or the SDB method, the surface cleanliness and roughness affect the bonding quality. The anodic bonding method needs to be implemented under the surface roughness of 1 μm or less, while the SDB method needs to be implemented under the surface roughness of 4 nm or less. As depicted by this condition, the surface roughness is one important factor in the SDB method.

The fusion bonding takes place in four steps. First, substrates are heated at room temperature until the substrates reach a temperature of 300° C. While the substrates are heated, oxygen ($O_2$), hydrogen ($H_2$), $H_2O$, and hydroxyl (—OH) containing molecules are bonded together, producing hydrogen bonds between the substrates. This step is an initial bonding.

Second, the substrates are heated to a temperature of 700° C. from 300° C. While the substrates are heated, due to the dehydration, the $H_2O$ molecules are detached from the hydrogen bonds and diffused outside. At this stage, the hydrogen bonds are mainly formed by the —OH group containing molecules. Also, the elasticity of the substrates (e.g., silicon substrates) changes, and thus, non-contact portions (i.e., non-bonded portions) of the substrates start contacting with each other.

Third, the heating temperature goes up from 700° C. to 1,000° C. In addition to the $H_2O$ molecules, hydrogen molecules are detached from the hydrogen bonds and vigorously diffused outside. As a result, the bonding is directed towards a state in which the $O_2$ molecules exist on a bonding interface (i.e., the interface between the substrates to be bonded). Also, the elasticity of the substrates changes more than before, thereby creating a strong bonding.

Fourth, the substrates are heated at a high temperature of 1,000° C. or more. Most of the atoms existing on the bonding interface disappear by diffusing into the inside or outside of the substrates (i.e., silicon). At the same time, the elasticity of the substrates changes, thereby providing the complete bonding.

Since the fusion bonding does not use a buffer or spacer usually interposed between the substrates as a medium, a high temperature treatment such as oxidation or diffusion can be performed. Since the bonding materials are substantially the same, their thermal coefficients are also the same. As a result, almost no thermal stress is exerted. The fusion bonding method can be effectively used in fabricating sensors and actuators based on silicon micromachining because various structures can be mechanically worked again by bonding the substrates (e.g., silicon) or performing several processes after the silicon bonding.

However, the fusion bonding is often sensitive to surface roughness, non-uniformity, and particles. In particular, the surface roughness needs to be controlled in an angstrom level. Due to this fact, even though the hermetic sealing is implemented based on strong covalent bonds formed through performing a high thermal annealing treatment at a temperature of 1,100° C., it is difficult to apply the fusion bonding method to semiconductor fabrication processes. A low temperature treatment with a precedent plasma treatment is being actively researched as one approach to overcome this difficulty.

According to a frit glass bonding (i.e., seal glass bonding) method, a glass powder including lead is mixed with a binder to obtain a paste. To achieve a bonding by using various methods such as a screen printer or an extrusion, the paste is placed over a region where MEMS processes proceed and bonded thereto at a temperature of 450° C. The frit glass bonding allows the hermetic sealing, and can be implemented to various vacuum devices. However, the frit glass bonding generally uses lead, which is not environmentally favorable, and occupies a large area in the wafer in addition to a chip area. Hence, the frit glass bonding method may not be implemented to the entire semiconductor fabrication process line.

According to an epoxy bonding (i.e., organic bonding) method, a high polymer such as polyimide or epoxy is used as a bonding medium. Thus, a low temperature treatment can be used in the epoxy bonding. However, the epoxy bonding method may not provide the hermetic sealing. Also, the epoxy boning method may have an aging effect due to a time factor, thereby resulting in a high chance of changing device characteristics. For these reasons, the epoxy bonding method is not currently considered for the implementation.

Among the above bonding methods, the anodic bonding method can provide an effect of using the same silicon wafers. However, the anodic bonding may provide a thermal degradation caused by a high thermal treatment. Accordingly, a wafer-level bonding method that can induce less stress caused by a thermal coefficient and be performed at low temperature needs to be developed to obtain reliable characteristics of MEMS devices.

In an attempt to achieve highly reliable MEMS device characteristics, a deep via formation method, a metal-metal bonding method, or a metal-silicon bonding method is proposed. However, the deep via formation method has the following disadvantages.

First, a bonding method based on the deep via formation and the metal-metal bonding may deteriorate sensors when a metal layer formed over a wafer for an MEMS sensor is etched to form a metal interconnection line. It may be difficult to control an etching for forming a deep via hole in a cap wafer responsible for packaging a top part. This difficulty is likely to affect uniformity in electroplating, further making it difficult to obtain a uniform bonding between the wafers. As a result, a small bonding margin may result, leading to a difficulty in obtaining intended yields. Also, since the cap wafer needs to be ground to a size of about 100 μm, a unit cost is expected to increase, while yields are expected to decrease.

Similar to the above bonding method based on the deep via formation and the metal-metal bonding, a bonding method based on the deep via formation and the metal-silicon bonding may have a difficulty in controlling the depth of a via hole in a cap wafer. A connection between a pad and a sensor wafer may be limited. Securing uniformity in bonding between wafers may be difficult. As a result, the wafers are less likely to be bonded together, thereby resulting in a decrease in yields. Also, the cap wafer needs to be ground to a size of about 100 μm in the bonding method based on the deep via formation and the metal-silicon bonding. Thus, a unit cost is expected to increase, while yields are expected to decrease.

SUMMARY OF THE INVENTION

Specific embodiments of the present invention provide a package of a micro-electro-mechanical systems (MEMS) device using a wafer-level packaging that can be applied to the entire semiconductor fabrication process, and a method for fabricating the same.

In accordance with one aspect of the present invention, there is provided a package of a micro-electro-mechanical systems (MEMS) device. The package includes a cap wafer, a plurality of bonding bumps formed over the cap wafer, a plurality of array pads arrayed on an outer side of the bonding bumps, and an MEMS device wafer bonded to an upper portion of the cap wafer in a manner to expose the array pads.

In accordance with another aspect of the present invention, there is provided a method for fabricating a package of a micro-electro-mechanical systems (MEMS) device. The method includes preparing a MEMS device wafer where a first trench is formed, preparing a cap wafer where a plurality of bonding bumps and a plurality of array pads are formed, the array pads formed in a region corresponding to the first trench and respectively coupled to the bonding bumps through inner interconnection lines, bonding the MEMS device wafer and the cap wafer to make the first trench and the array pads correspond to each other, grinding a rear portion of the MEMS device wafer to form an opening line exposing the array pads, and dicing the MEMS device wafer and the cap wafer.

DESCRIPTION OF SPECIFIC EMBODIMENTS

Figure 1:
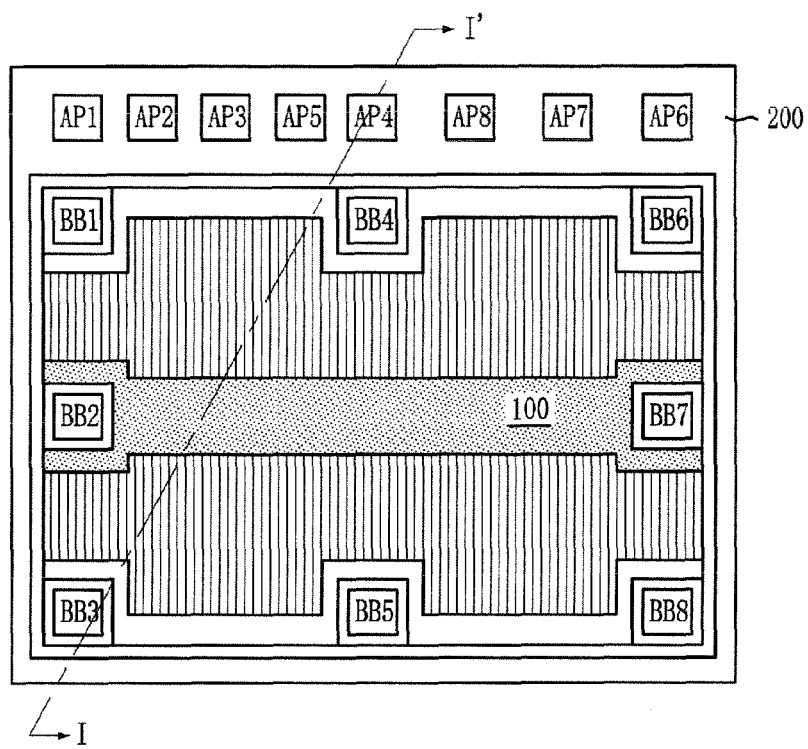
FIG. 1 illustrates a simplified top view of a package of micro-electro-mechanical systems (MEMS) device in accordance with an embodiment of the present invention.

In the following drawings, the thickness of layers and regions are exaggerated for clarity of the description, and when it is described that one layer is formed on another layer or a substrate, the term "on" indicates that the layer may be formed directly on the other layer or the substrate, or a third layer may be interposed therebetween. Also, it should be noted that like reference numerals denote like elements even in different drawings.

Figure 2:
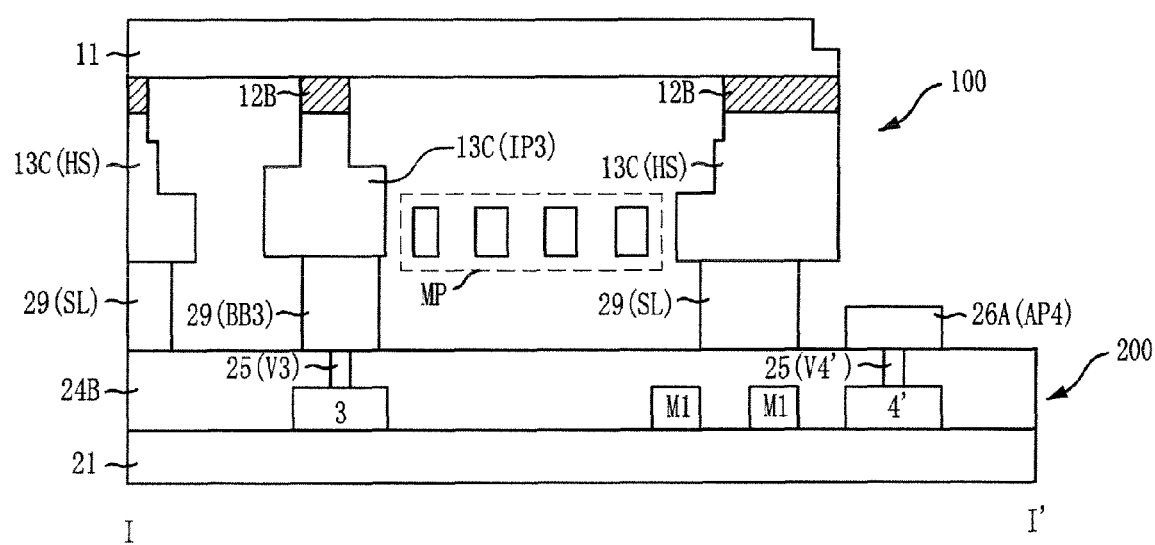
FIG. 2 illustrates a simplified cross-sectional view of the package taken along a line I-I' illustrated in FIG. 1.

FIG. 1 illustrates a simplified top view of a package of micro-electro-mechanical systems (MEMS) device in accordance with an embodiment of the present invention. FIG. 2 illustrates a simplified cross-sectional view of the package taken along a line I-I' illustrated in FIG. 1. Among various MEMS devices, a sensor for acceleration, angular velocity, sound, geomagnetism, or an F-bar value is illustrated.

With reference to FIGS. 1 and 2, the package of the MEMS device includes a cap wafer 200 (hereinafter referred to as a first substrate), a plurality of bonding bumps BB1 to BB8, a plurality of array pads AP1 to AP8, and a wafer 100 for use in a MEMS device (hereinafter referred to as a second substrate). The bonding bumps BB1 to BB8 are formed to encompass a central portion of the first substrate 200. The array pads AP1 to AP8 are arrayed around the outside of the bonding bumps BB1 to BB8. The second substrate 100 is bonded to the first substrate 200 in a manner to expose the array pads AP1 to AP8. The package further includes a sealing line SL formed between the bonding bumps BB1 to BB8 and the array pads AP1 to AP8 to encompass the bonding bumps BB1 to BB8.

Figure 3:
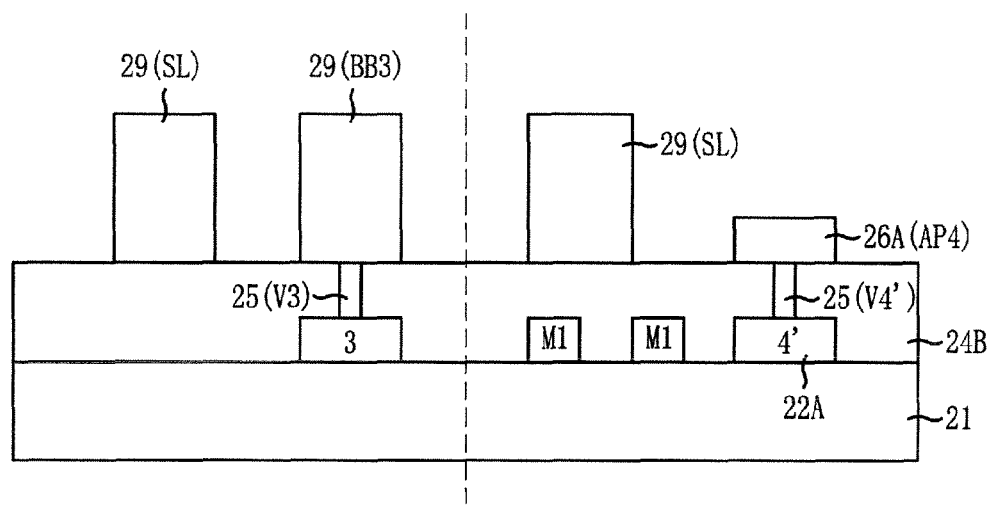
FIG. 3 illustrates a simplified cross-sectional view of a cap wafer illustrated in FIG. 2.
Figure 4:
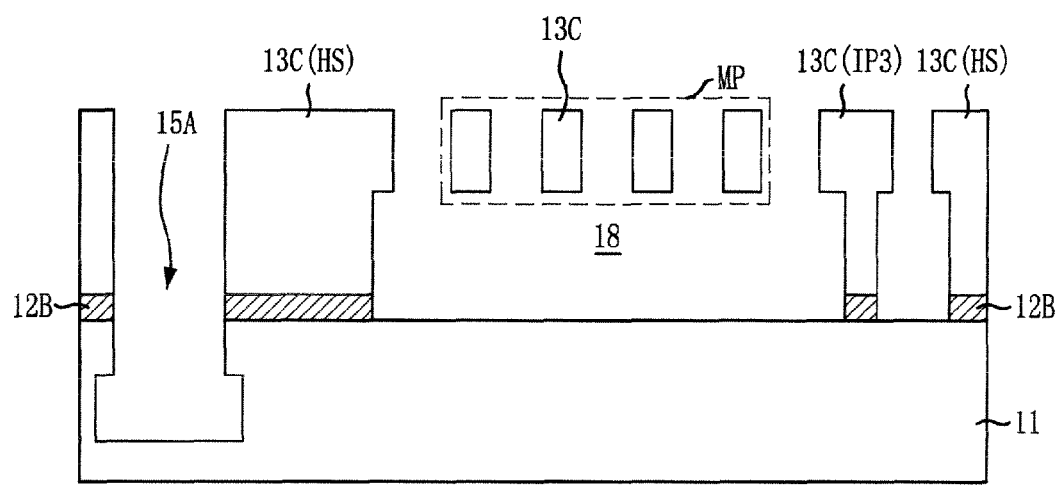
FIG. 4 illustrates a simplified cross-sectional view of an MEMS sensor illustrated in FIG. 2.

With reference to FIGS. 3 and 4, the package taken along a line I-I' illustrated in FIGS. 1 and 2 will be described in detail.

The first substrate 200 includes a plurality of inner pads 1 to 8 respectively coupled to the bonding bumps BB1 to BB8, and a plurality of outer pads 1' to 8' respectively coupled to the inner pads 1 to 8 through inner interconnection lines M1. The inner pads 1 to 8, the outer pads 1' to 8', and the inner interconnection lines M1 are simultaneously formed at the same layer level by performing the same metal interconnection line process. The first substrate 200 further includes a first group of via plugs V1 to V8 and a second group of via plugs V1' to V8'. The first group of the via plugs V1 to V8 electrically couple the inner pads 1 to 8 to the respective bonding bumps BB1 to BB8, and the second group of the via plugs V1' to V8' electrically couple the outer pads 1' to 8' to the respective array pads AP1 to AP8. Hereinafter, the first group of the via plugs V1 to V8 and the second group of the via plugs V1' to V8' will be referred to as first and second plugs, respectively. The first plugs V1 to V8 and the second plugs V1' to V8' are formed at the same layer level by performing a single damascene process. Also, reference numerals 21 and 24B represent a silicon oxide (e.g., $SiO_2$) layer and an insulation layer where the first plugs V1 to V8 and the second plugs V1' to V8' are formed, respectively.

As illustrated, the bonding bumps BB1 to BB8 may be formed in the total number of 8 over the first substrate 200 such that the sealing line SL encompasses the bonding bumps BB1 to BB8. Four of the bonding bumps BB1 to BB8 are formed in respective four corners of the sealing line SL. The rest four of the bonding bumps BB1 to BB8 are formed in respective regions between the four corners of the sealing line SL. When the first substrate 200 and the second substrate 100 are bonded together, the bonding bumps BB1 to BB8 are electrically coupled to respective inner pads IP1 to IP8, which are formed over the second substrate 100 to correspond to the bonding bumps BB1 to BB8. The number and position of the bonding bumps BB1 to BB8 are not limited to the above description, and can be adjusted according to the design.

The sealing line SL is formed to provide a hermetic sealing when the first substrate 200 and the second substrate 100 are bonded together. As mentioned above, the sealing line SL is formed to encompass the bonding bumps BB1 to BB8. During the bonding of the first and second substrates 200 and 100, the sealing line SL bonds to barrier walls HS, which are formed to provide a hermetic sealing of the second substrate 100.

The bonding bumps BB1 to BB8 and the sealing line SL can be formed by a under bump metallization (UBM) process. Each of the bonding bumps BB1 to BB8 and the sealing line SL is formed in a single layer including one selected from a first group consisting of Ti TiW, Ni, Cu, W, Au, Pt, Ag, Al, NiV, and CrV, or in a stack structure including one selected from a second group consisting of Au, Cu, and Ni, which is formed over a layer of the material selected from the first group. Each of the bonding bumps BB1 to BB8 and the sealing line SL can be formed in a UBM layer/Cu/solder cap structure or a UBM layer/Au/solder cap structure. At this time, the UBM layer is formed in a single layer including one selected from a first group consisting of Ti TiW, Ni, Cu, W, Au, Pt, Ag, Al, NiV, and CrV, or in a stack structure including one selected from a second group consisting of Au, Cu, and Ni, which is formed over a layer of the material selected from the first group. Each of the bonding bumps BB1 to BB8 and the sealing line SL may also include a material selected from a group consisting of Au, Cu, and Ni.

The array pads AP1 to AP8 function as pads for a wire bonding to an external device. The array pads AP1 to AP8 are electrically coupled to an external device (e.g., printed circuit board (PCB)) through a wire bonding. The array pads AP1 to AP8 are arrayed in a line on one outer side of the four sides of the sealing line SL formed in a square shape. When the first substrate 200 and the second substrate 100 are bonded together, the array pads AP1 to AP8 are not covered with the second substrate 100, but exposed.

The second substrate 100 includes a silicon on insulator (SOI) substrate 11, an oxide-based insulation layer 12B that is patterned twice, and a low-resistance silicon-based layer 13C that is patterned three times. The third patterned silicon-based layer 13C is an epitaxial layer. The third patterned silicon-based layer 13C functions as a moving part MP including a plurality of patterns that are separated from each other, as a fixing part including the inner pads IP1 to IP8 of the second substrate 100, and as the barrier walls HS for the hermetic sealing.

As illustrated in FIGS. 2 to 4, the moving part MP including the separated patterns is separated from the second substrate 100. However, the moving part MP is supported by the inner pads IP1 to IP8 that actually function as the fixing part.

When the first substrate 200 and the first substrate 100 are bonded together, the inner pads IP1 to IP8 of the second substrate 100 are formed to correspond to the inner pads 1 to 8 of the first substrate 200 to contact the bonding bumps BB1 to BB8 formed over the first substrate 200.

Also, when the first substrate 200 and the second substrate 100 are bonded together, the barrier walls HS for the hermetic sealing are bonded to the sealing line SL of the first substrate 200, so as to seal the inside of the package obtained by bonding the first substrate 200 and the second substrate 100 together.

A method for fabricating the package of the MEMS device illustrated in FIGS. 1 to 4 will be described hereinafter.

Figure 5:
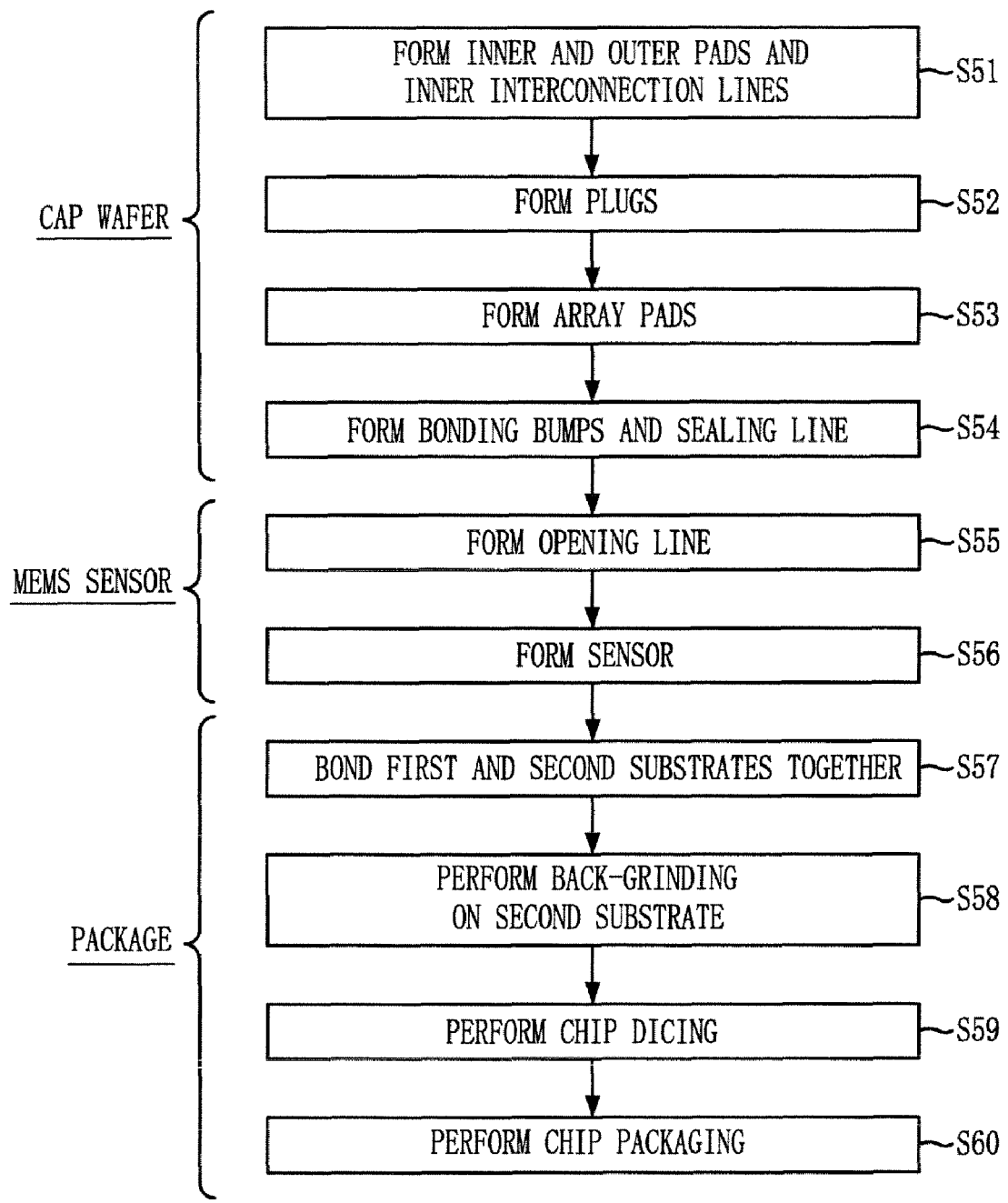
FIG. 5 illustrates a simplified flowchart for a method for fabricating a package of a MEMS device in accordance with an embodiment of the present invention.

FIG. 5 illustrates a simplified flowchart for a fabrication method of the package of the MEMS device in accordance with an embodiment of the present invention. In particular, FIG. 5 illustrates the fabrication of the package by fabricating the cap wafer first and then the MEMS device. However, this illustrated order is merely illustrative. In other words, the cap wafer and the MEMS device can be fabricated in a reversible order from the illustrated one, or at the same time.

Figure 6:
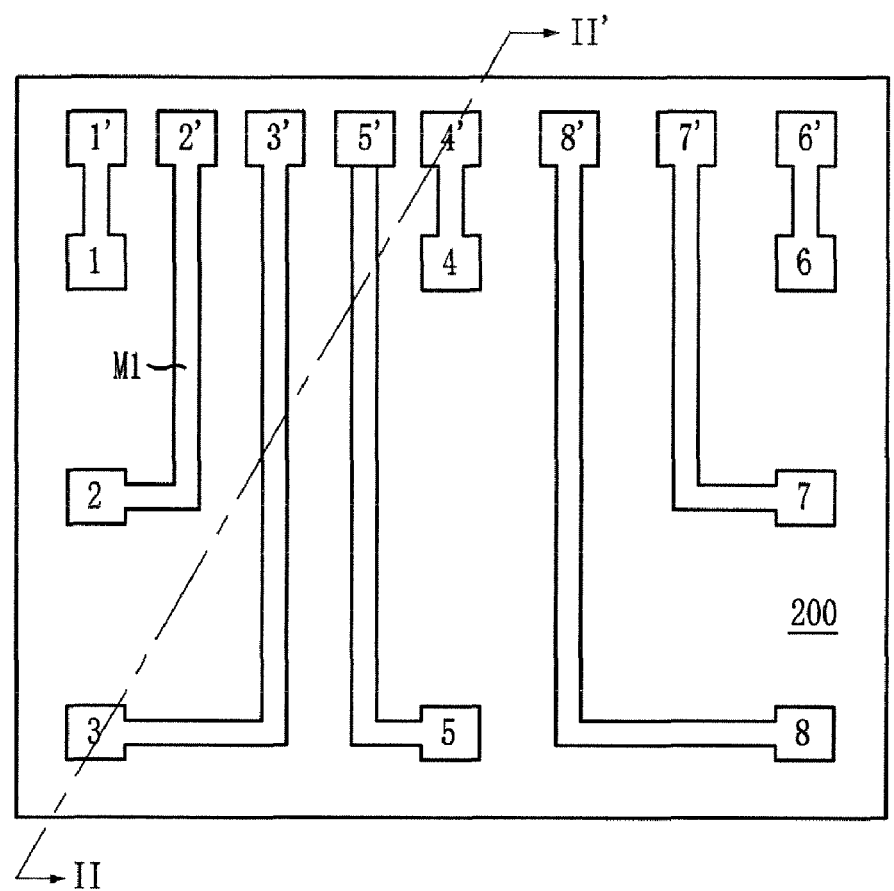
FIG. 6 illustrates a simplified top view of a structure associated with 'S51' illustrated in FIG. 5.

With reference to FIG. 5, the fabrication of the cap wafer will be described. At step S51, a plurality of inner pads 1 to 8, a plurality of outer pads 1' to 8', and inner interconnection lines M1 are formed over a first substrate 200 where a silicon oxide layer 21 (e.g., $SiO_2$ layer) is formed. With reference to FIG. 6 and FIGS. 7A to 7D, the formation of the inner pads 1 to 8, the outer pads 1' to 8', and the inner interconnection lines M1 (i.e., step 'S51') will be described in detail. FIG. 6 illustrates a simplified top view of a structure associated with 'S51'. FIGS. 7A to 7D illustrate simplified cross-sectional views of structures obtained after certain processes taken along a line II-II' illustrated in FIG. 6.

Figure 7A:
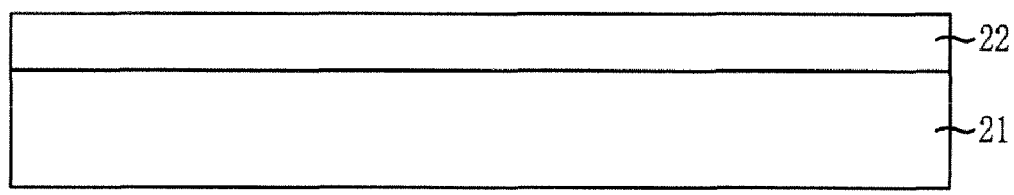
FIGS. 7A to 7D illustrate simplified cross-sectional views of structures formed after certain processes taken along a line II-II' illustrated in FIG. 6.
Figure 7B:
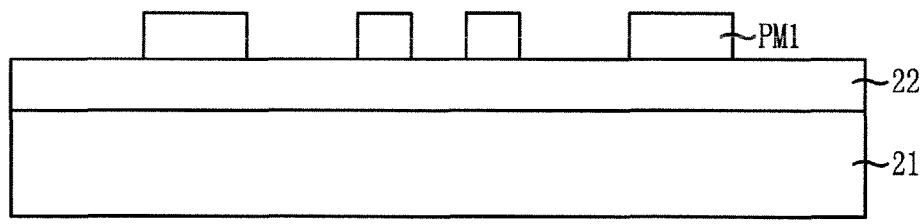
Figure 7C:
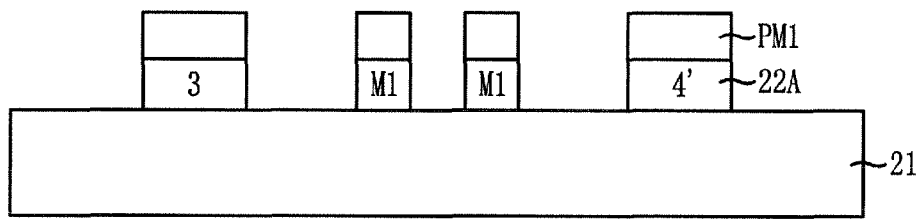
Figure 7D:
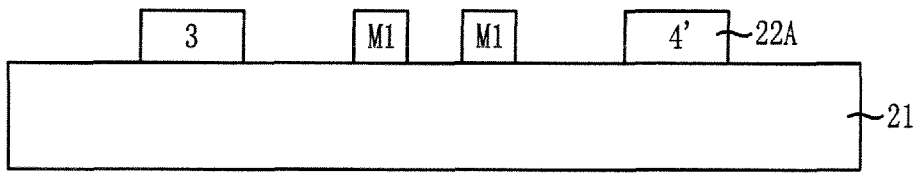

Referring to FIG. 7A, a conductivity layer 22 is formed over the first substrate 200 where the silicon oxide layer 21 is formed. The conductivity layer 22 includes aluminum (Al), and will be referred to as an Al layer hereinafter. Referring to FIG. 7B, a photoresist layer is formed over the Al layer 22, and exposed to light and developed using a photomask to form a first photoresist pattern PM1. Referring to FIG. 7C, the Al layer 22 (see FIG. 7B) is etched using the first photoresist pattern PM1 as an etch mask to form patterned Al layers 22A. The patterned Al layers 22A function as the inner pads 1 to 8, the outer pads 1' to 8', and the inner interconnection lines M1 that respectively couple the inner pads 1 to 8 to the outer pads 1' to 8'. Referring to FIG. 7D, the first photoresist pattern PM1 is removed.

Figure 8:
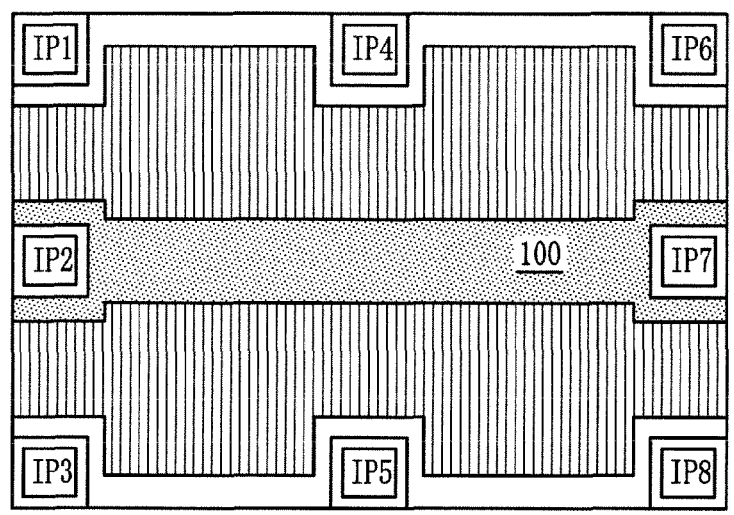
FIG. 8 illustrates a simplified top view of an MEMS sensor corresponding to the cap wafer illustrated in FIG. 6.
Figure 9:
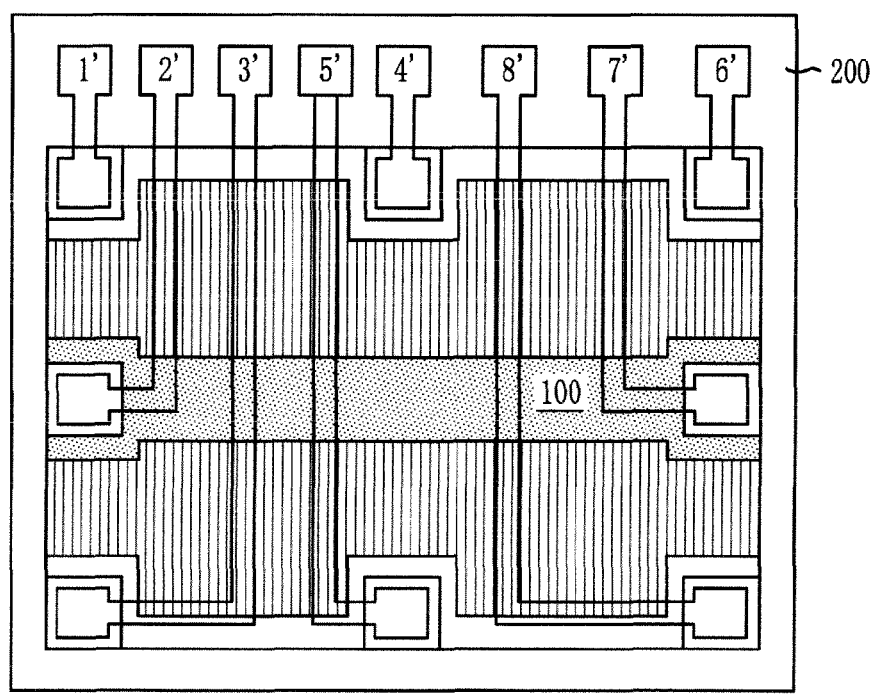
FIG. 9 illustrates a simplified top view of the cap wafer illustrated in FIG. 6 and the MEMS sensor illustrated in FIG. 8 after being bonded together.

After the completion of the serial processes illustrated in FIGS. 7A to 7D, the inner pads 1 to 8, the outer pads 1' to 8' and the inner interconnection lines M1 are formed. The inner pads 1 to 8 are formed in regions corresponding to regions where the inner pads IP1 to IP8 of the second substrate 100 (e.g., an MEMS sensor die) illustrated in FIG. 8. When the first substrate 200 and the second substrate 100 are bonded together, as illustrated in FIG. 9, the inner pads 1 to 8 of the first substrate 200 and the inner pads IP1 to IP8 of the MEMS sensor die are bonded together in a manner to face each other correspondingly.

Figure 10:
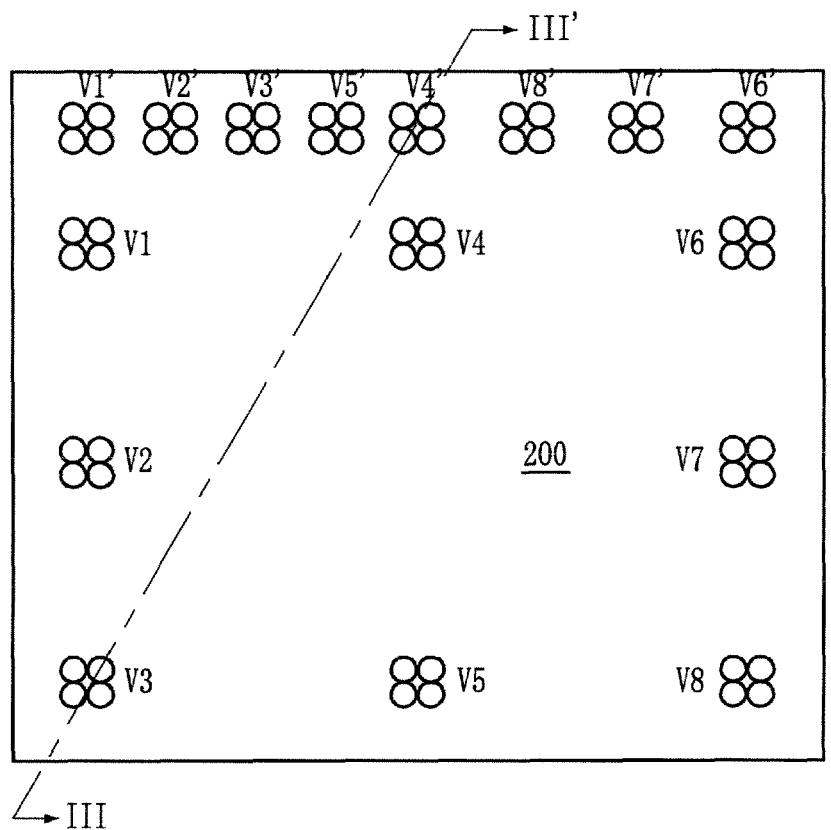
FIG. 10 illustrates a simplified top view of a structure associated with 'S52' illustrated in FIG. 5.

At step S52, first plugs V1 to V8 and second plugs V1' to V8' are formed. With reference to FIG. 10 and FIGS. 11A to 11D, detailed description of 'S52' will be provided hereinafter. FIG. 10 illustrates a simplified top view of a structure associated with 'S52' illustrated in FIG. 5. FIGS. 11A to 11D illustrate cross-sectional views of structures obtained after certain processes taken along a line III-III' illustrated in FIG. 10.

Figure 11A:
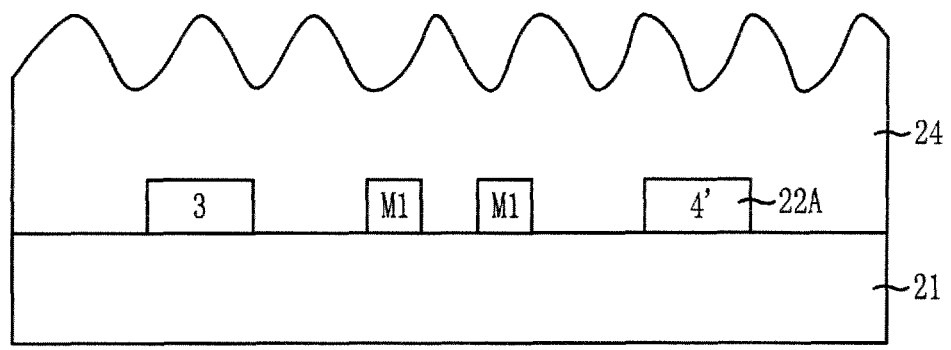
FIGS. 11A to 11D illustrate cross-sectional views of structures formed after certain processes taken along a line III-III' illustrated in FIG. 10.

Referring to FIG. 11A, an insulation layer 24 is formed over the resultant structure illustrated in FIG. 7D. The insulation layer 24 includes an oxide-based material. For instance, the insulation layer 24 may be a borophosphosilicate glass (BPSG) layer, a phosphosilicate glass (PSG) layer, a tetraethyl orthosilicate (TEOS) layer, a spin on glass (SOG) layer, or a spin on dielectric (SOD) layer.

Figure 11B:
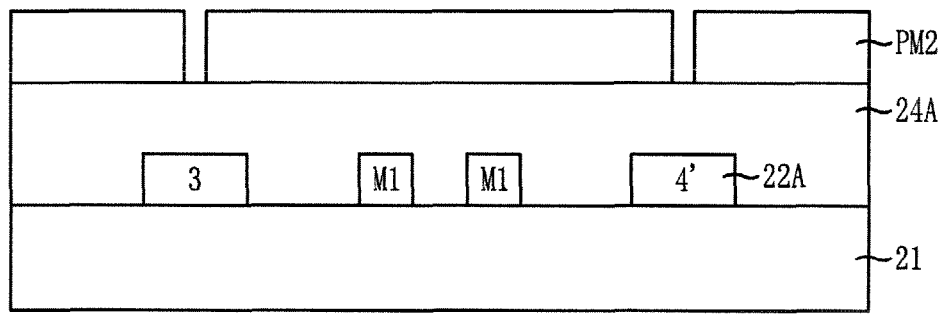
Figure 11C:
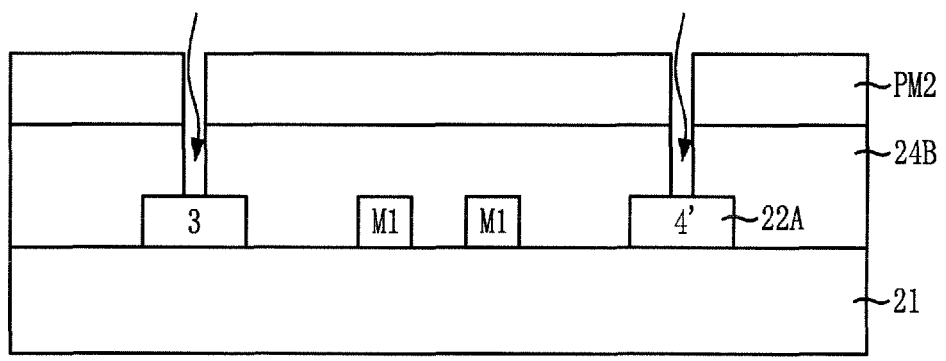
Figure 11D:
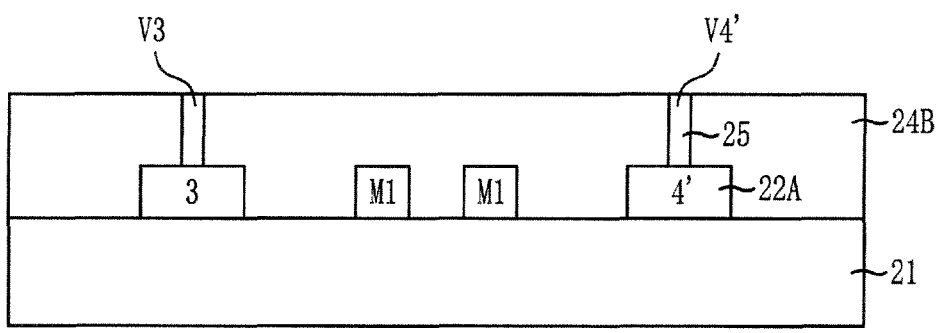

Referring to FIG. 11B, the insulation layer 24 (see FIG. 11A) is planarized by chemical mechanical polishing (CMP). A second photoresist pattern PM2 is formed over a planarized insulation layer 24A. Referring to FIG. 11C, the planarized insulation layer 24A is etched using the second photoresist pattern PM2 as an etch mask to form via holes (see regions indicated by arrows) that expose the inner pads 1 to 8 and the outer pads 1' to 8'. Reference numeral 24B represents an insulation layer in which the via holes are formed in the planarized insulation layer 24A. Referring to FIG. 11D, the second photoresist pattern PM2 is removed. A tungsten (W) layer 25 fills the via holes, and is planarized by CMP to form the first plugs V1 to V8 and the second plugs V1' to V8' that are respectively coupled to the inner pads 1 to 8 and the outer pads 1' to 8'.

Figure 12:
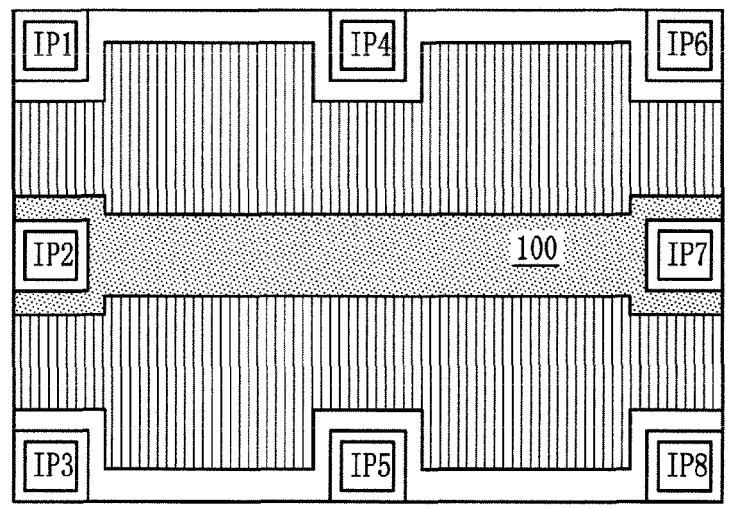
FIG. 12 illustrates a simplified top view of an MEMS sensor corresponding to the cap wafer illustrated in FIG. 10.
Figure 13:
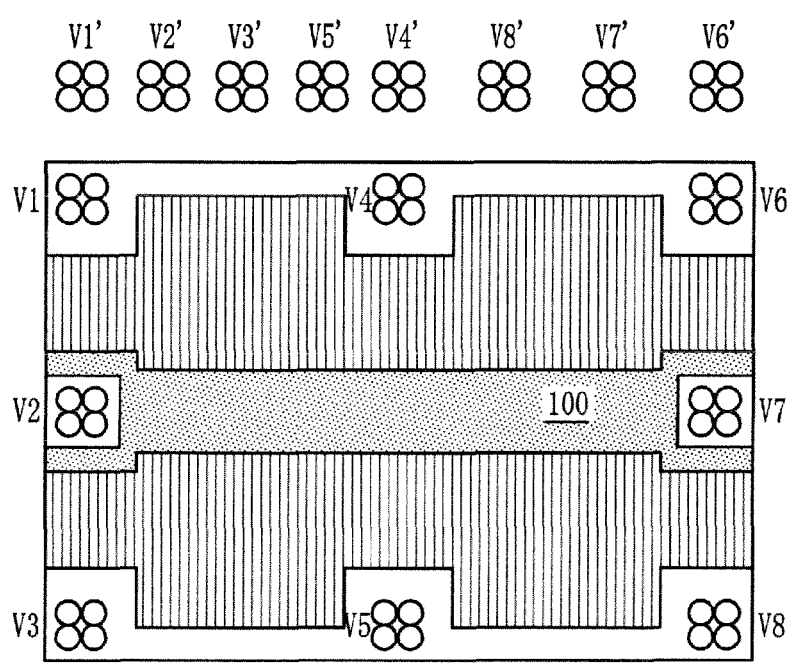
FIG. 13 illustrates a simplified top view of the cap wafer illustrated in FIG. 10 and the MEMS sensor illustrated in FIG. 12 after being bonded together.

After the completion of the serial processes illustrated in FIGS. 11A to 11D, as illustrated in FIG. 10, the first plugs V1 to V8, which are coupled to the respective inner pads 1 to 8, and the second plugs V1' to V8', which are coupled to the respective outer pads 1' to 8', are formed. As illustrated in FIGS. 12 and 13, the regions where the first plugs V1 to V8 correspond to the regions where the inner pads IP1 to IP8 are formed when the first substrate 200 and the second substrate 100 are bonded together. The regions where the second plugs V1' to V8' are formed are not covered by the second substrate 100.

Figure 14:
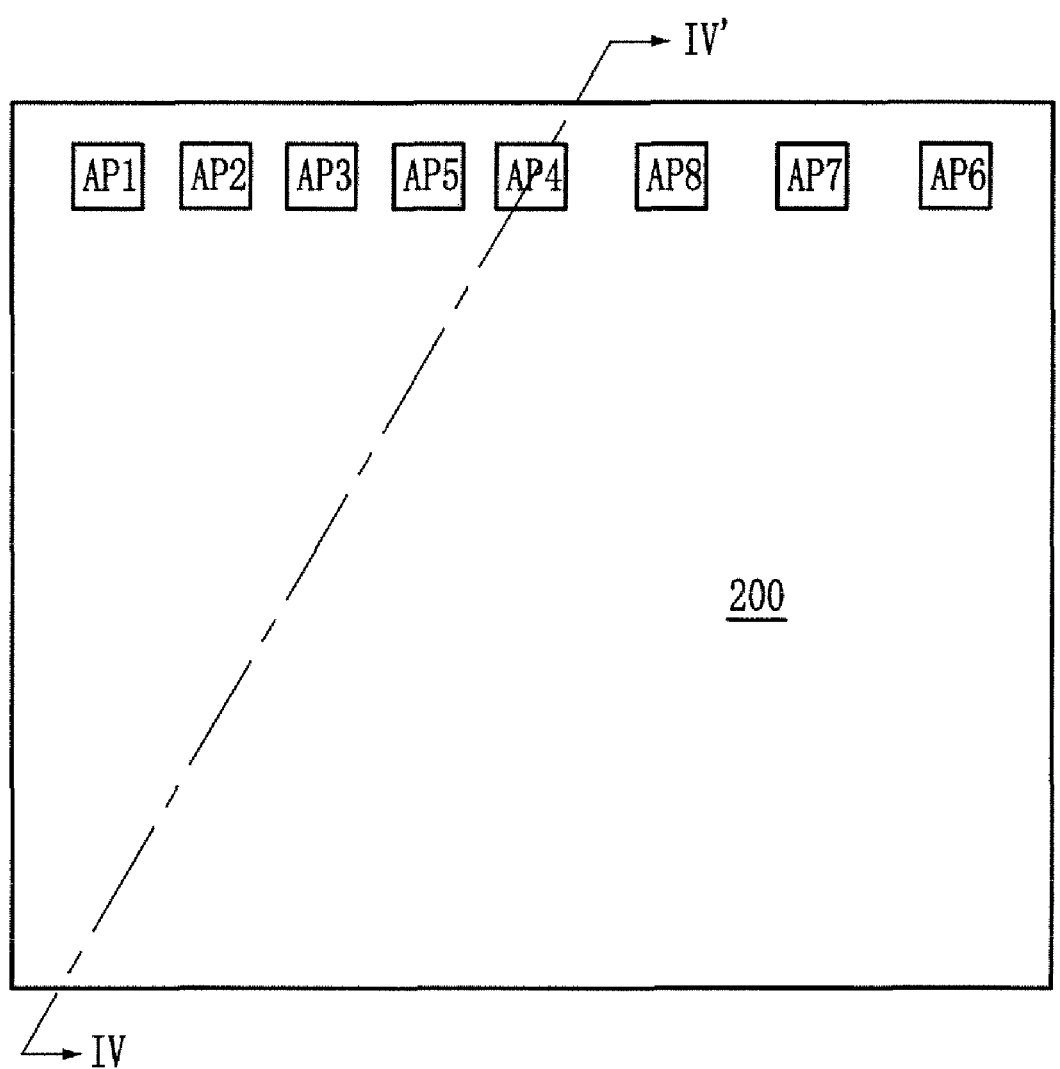
FIG. 14 illustrates a top view of a structure associated with 'S53' illustrated in FIG. 5.
Figure 15A:
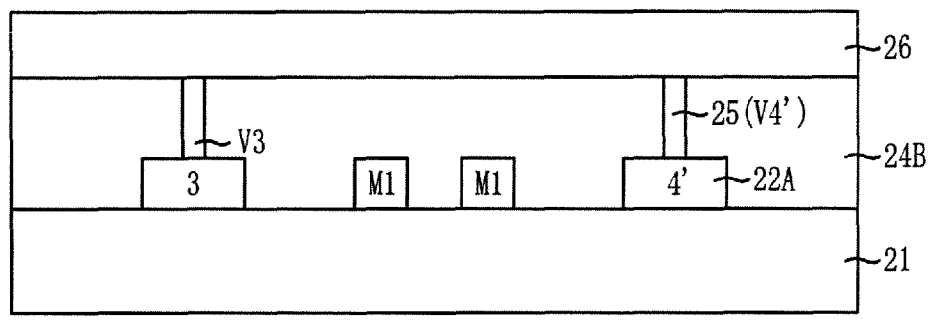
FIGS. 15A to 15C illustrate simplified cross-sectional views of structure obtained after certain processes taken along a line IV-IV' illustrated in FIG. 14.
Figure 15B:
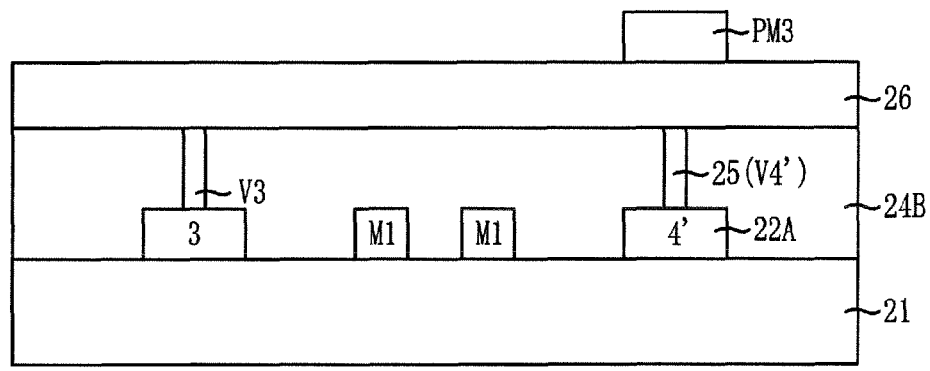
Figure 15C:
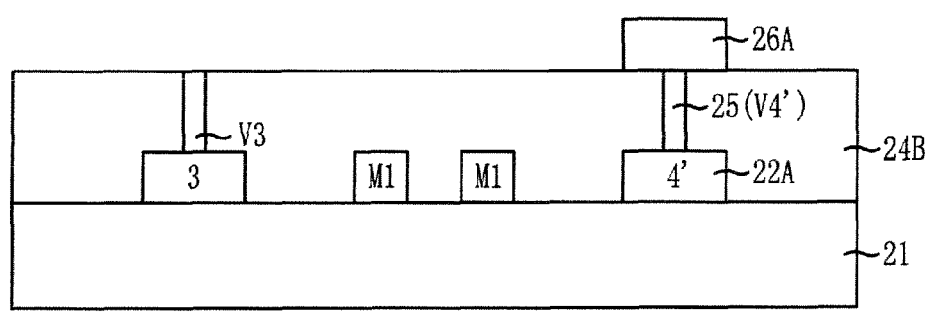
Figure 16:
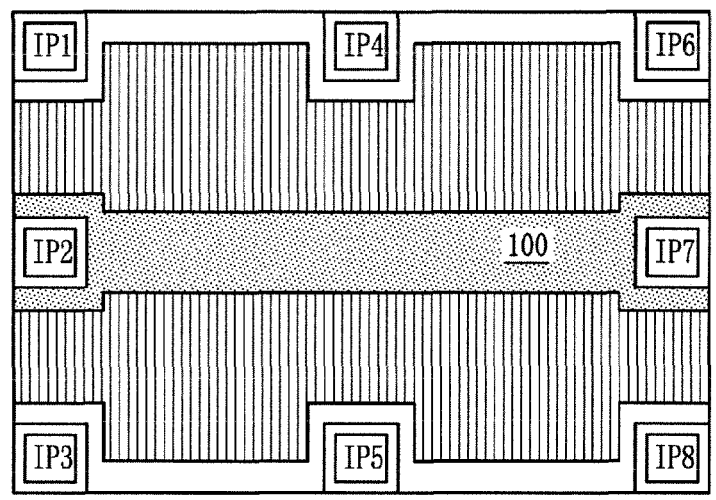
FIG. 16 illustrates a simplified top view of an MEMS sensor corresponding to the cap wafer illustrated in FIG. 14.

At step S53, array pads AP1 to AP8 are formed. With reference to FIG. 14 and FIGS. 15A to 15C, the formation of the array pads AP1 to AP8 will be described in detail. FIG. 14 illustrates a top view of a structure associated with 'S53' illustrated in FIG. 5. FIGS. 15A to 15C illustrate simplified cross-sectional views of structures obtained after certain processes taken along a line IV-IV' illustrated in FIG. 14.

Referring to FIG. 15A, another Al layer 26 is formed over the resultant structure illustrated in FIG. 11D. The other Al layer 26 is formed to a thickness in a range of about 1,500 Å to 10,000 Å. Referring to FIG. 15B, a third photoresist pattern PM3 is formed. Referring to FIG. 15C, the other Al layer 26 is etched using the third photoresist pattern PM3 as an etch mask to form another patterned Al layers 26A over the second plugs V1' to V8'. The other patterned Al layers 26A are used as the array pads AP1 to AP8. The etching of the other Al layer 26 needs to be performed under the condition that does not generate a height difference in the regions where the first plugs V1 to V8 are formed and that does not generate a non-uniform height difference in a region where a sealing line SL is to be formed. One method that does not generate the height difference is a lift-up type single damascene process instead of performing the etching to form the array pads AP1 to AP8. According to the lift-up type single damascene process, prior to forming an Al layer, a photoresist pattern having openings therein is formed over the regions where the array pads AP1 to AP8 are formed, and the Al layer fills the openings. The photoresist pattern is removed.

Figure 17:
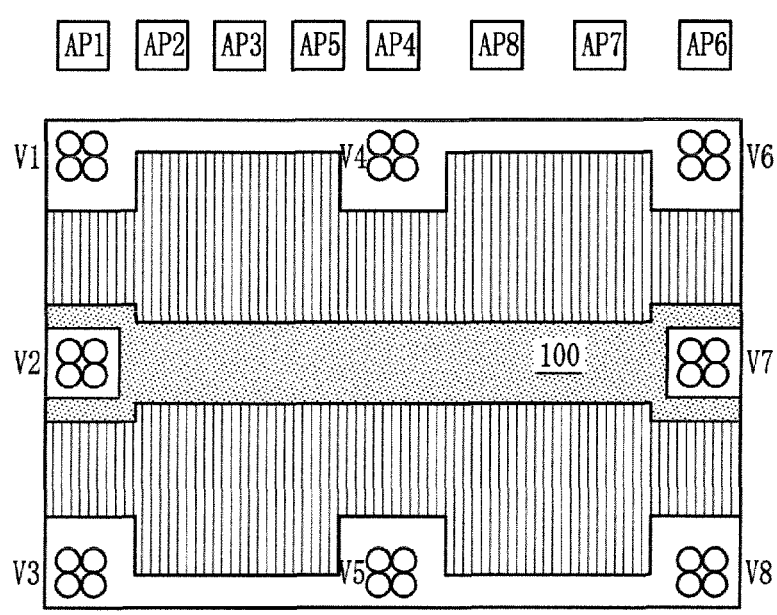
FIG. 17 illustrates a simplified top view of the cap wafer illustrated in FIG. 14 and the MEMS sensor illustrated in FIG. 16 after being bonded together.

After the completion of the serial processes illustrated in FIGS. 15A to 15C, the array pads AP1 to AP8 that are coupled to the respective second plugs V1' to V8' are formed. As illustrated in FIG. 17, the regions where the array pads AP1 to AP8 are outer regions that are not covered by the second substrate 100 when the first substrate 200 and the first substrate 100 are bonded together.

Figure 18:
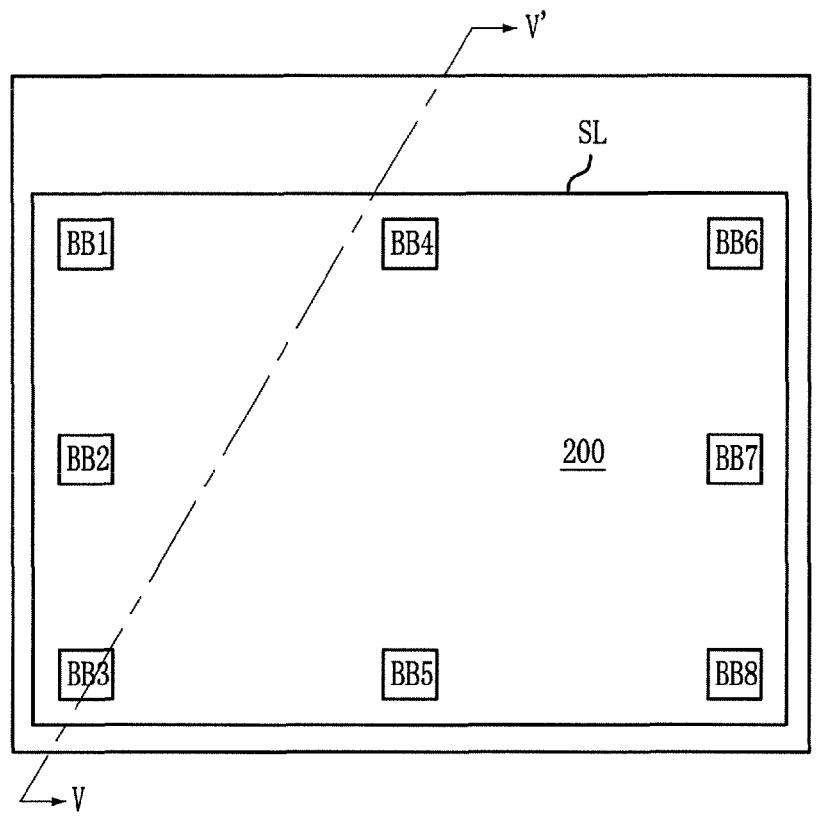
FIG. 18 illustrates a simplified top view of a structure associated with 'S54' illustrated in FIG. 5.

At step S54, bonding bumps BB1 to BB8 and the aforementioned sealing line SL are formed. With reference to FIG. 18 and FIGS. 19A to 19D, the formation of the bonding bumps BB1 to BB8 and the sealing line SL will be described in detail. FIG. 18 illustrates a simplified top view of a structure associated with 'S54' illustrated in FIG. 5. FIGS. 19A to 19D illustrate simplified cross-sectional views of structures obtained after certain processes taken along a line V-V' illustrated in FIG. 18.

Figure 19A:
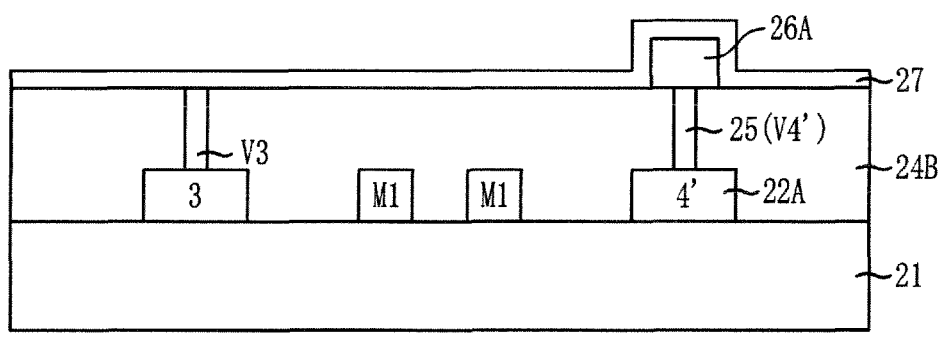
FIGS. 19A to 19D illustrate simplified cross-sectional views of structures obtained after certain processes taken along a line V-V' illustrated in FIG. 18.
Figure 19B:
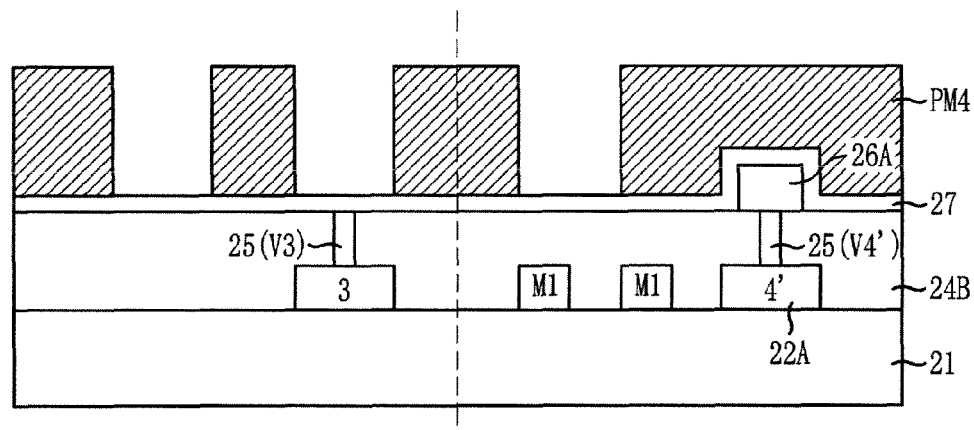
Figure 19C:
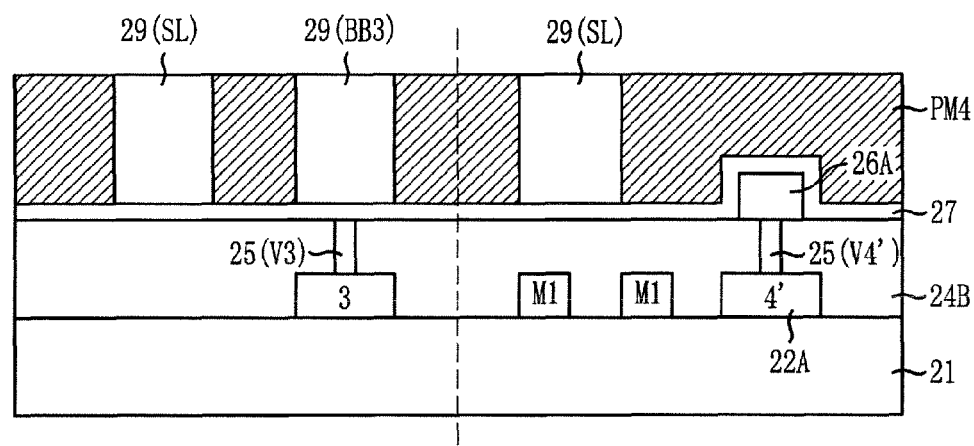
Figure 19D:
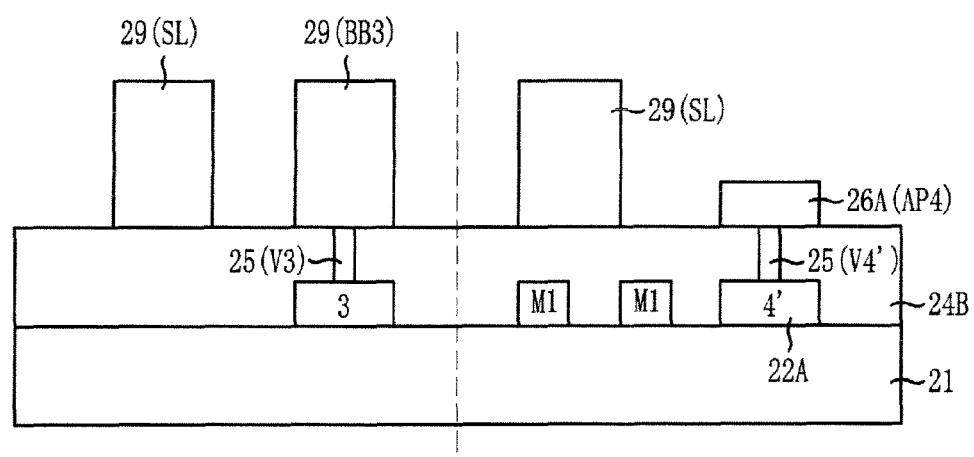

Referring to FIG. 19A, a seed layer 27 is formed over the resultant structure illustrated in FIG. 15C. Referring to FIG. 19B, a fourth photoresist pattern PM4 is formed over the seed layer 27. Referring to FIG. 19C, a metal layer 29 for use in the bonding bumps BB1 to BB8 and the sealing line SL is formed by electroplating using the fourth photoresist pattern PM4. Referring to FIG. 19D, the fourth photoresist pattern PM4 is removed. The seed layer 27 is etched away to form the bonding bumps BB1 to BB8 and the sealing line SL.

The bonding bumps BB1 to BB8 and the sealing line SL are formed to have substantially the same width to minimize height variation. If the width of the sealing line SL is enlarged to increase the bonding intensity, the sealing line SL is formed using an N multiple of metal interconnection lines having the width of the bonding bumps BB1 to BB8, where N is an integer, instead of using a single metal interconnection line having a large width. A distance between the metal interconnection lines needs to be determined towards decreasing its height difference considering the pattern density. The bonding bumps BB1 to BB8 and the sealing line SL are formed to have an area that is about 7% to 35% of the total area of the first substrate 200 because the bonding intensity between the first substrate 200 and the first substrate 100 is affected by the area of the bonding bumps BB1 to BB8 and the sealing line SL. That is, a certain area of the bonding bumps BB1 to BB8 and the sealing line SL needs to be secured to maintain a sufficient level of the bonding intensity between the first substrate 200 and the second substrate 100 during a back-grinding process performed after the bonding of the first and second substrates 200 and 100. For instance, a thickness of the bonding bumps BB1 to BB8 and the sealing line SL ranges from about 10 μm to 30 μm to provide a space for installing a moving part MP of the MEMS sensor. A width of the bonding bumps BB1 to BB8 and the sealing line SL ranges from about 10 μm to 100 μm considering the bonding intensity. A height difference between the bonding bumps BB1 to BB8/sealing line SL and the array pads AP1 to AP8 is in a range of about 10 μm or more in order to secure a certain degree of freedom during a subsequent wire bonding treatment.

Figure 20:
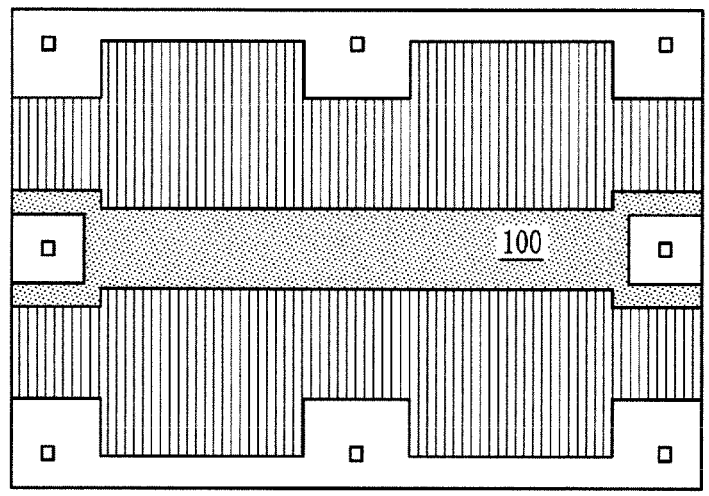
FIG. 20 illustrates a simplified top view of an MEMS sensor corresponding to the cap wafer illustrated in FIG. 18.
Figure 21:
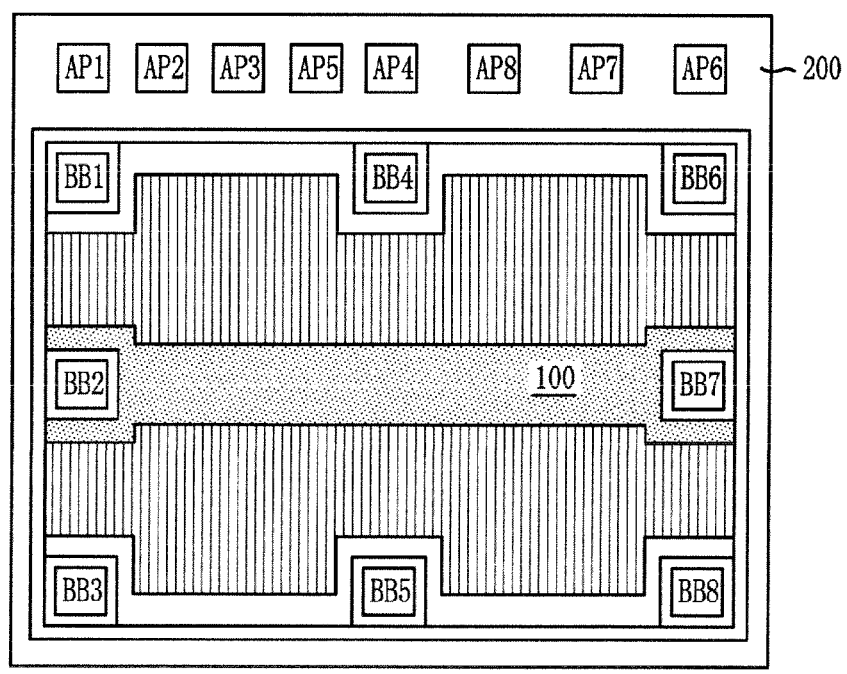
FIG. 21 illustrates a simplified top view of the cap wafer illustrated in FIG. 18 and the MEMS sensor illustrated in FIG. 20 after being bonded together.

After the completion of the serial processes illustrated in FIGS. 19A to 19D, the bonding bumps BB1 to BB8 are coupled to the respective first plugs V1 to V8 as illustrated in FIGS. 18, 20 and 21. The sealing line SL is formed to encompass the bonding bumps BB1 to BB8.

The aforementioned MEMS sensor is fabricated as follows. At steps S55 and S56, an opening line is formed to correspond to the array pads AP1 to AP8, and a sensor is formed. With reference to FIGS. 22A to 22J, detailed description of 'S55' and 'S56' will be provided hereinafter. Although it is exemplified in the present embodiment that a body of the sensor is employed as an electrode using a low-resistance SOI substrate, substantially the same wafer level packaging can proceed by forming a metal-based electrode over a sensor region of a typical wafer.

Figure 22A:
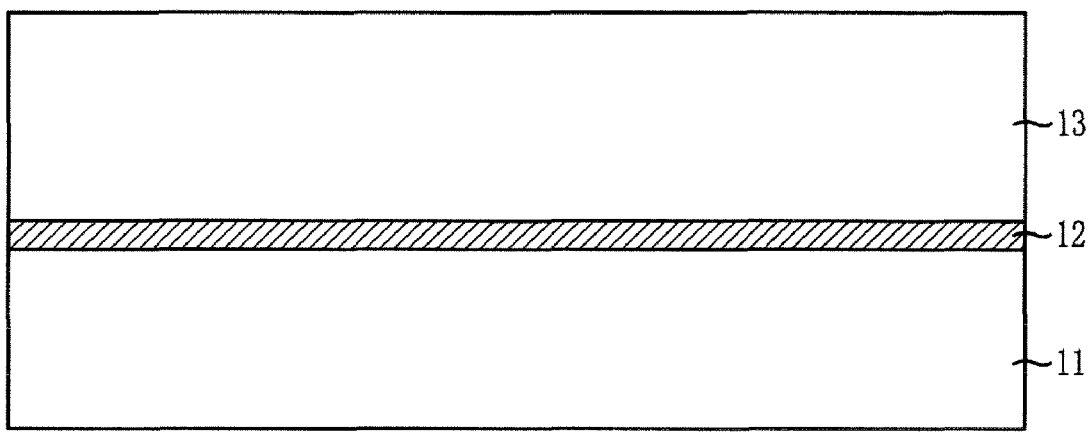
FIGS. 22A to 22J illustrate cross-sectional views of structures associated with 'S57' and 'S56' illustrated in FIG. 5.
Figure 22B:
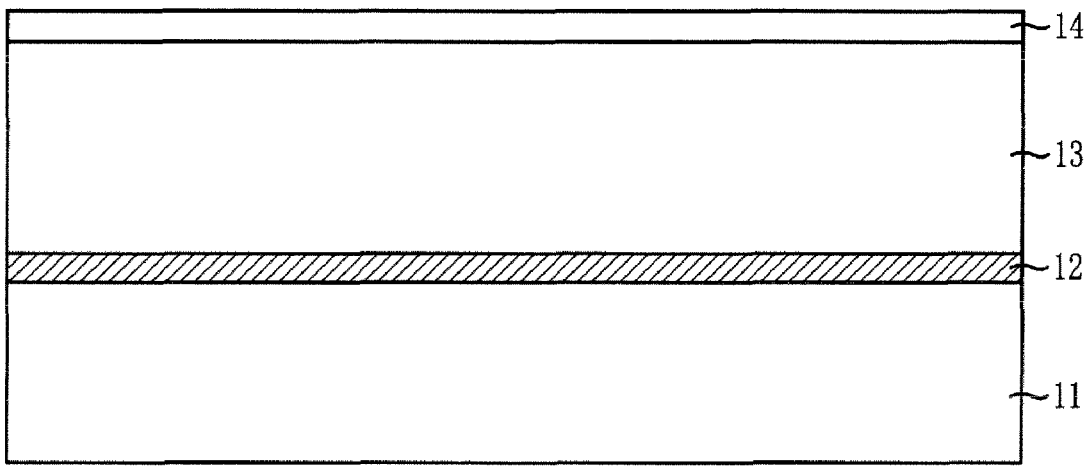
Figure 22C:
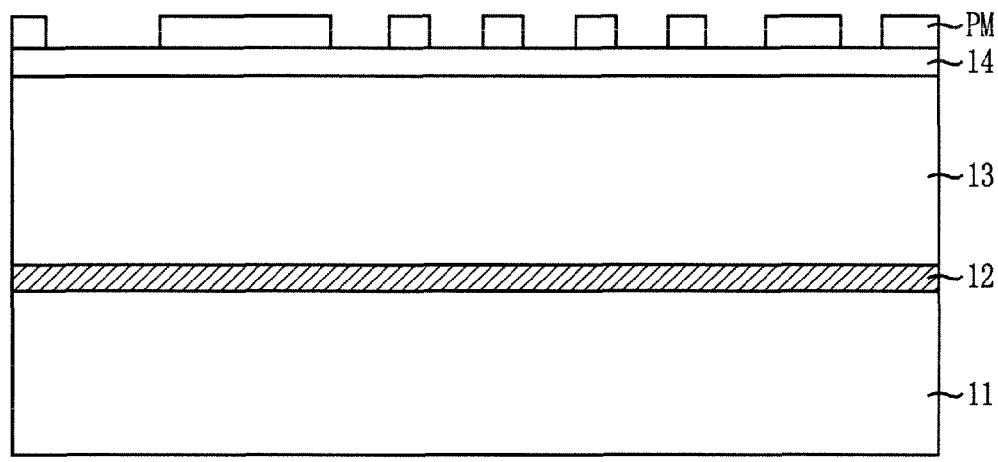
Figure 22D:
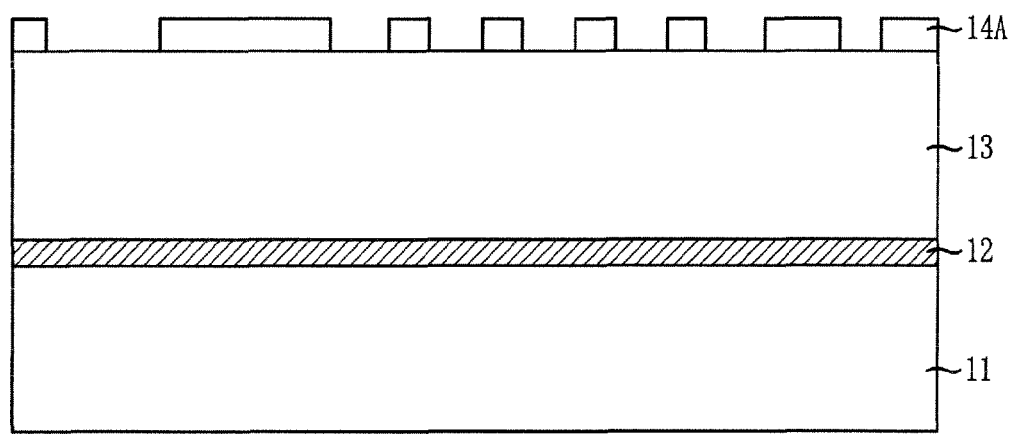

Referring to FIG. 22A, an insulation layer 12 and a silicon-based layer 13 are formed over a low-resistance SOI substrate 11. Referring to FIG. 22B, a hard mask layer 14 is formed over the silicon-based layer 13. The hard mask layer 14 includes a nitride-based material. Referring to FIG. 22C, a photoresist pattern PM is formed over the hard mask layer 14. Referring to FIG. 22D, the hard mask layer 14 is etched using the photoresist pattern PM as an etch mask to form a hard mask 14A. The photoresist pattern PM is removed.

Figure 22E:
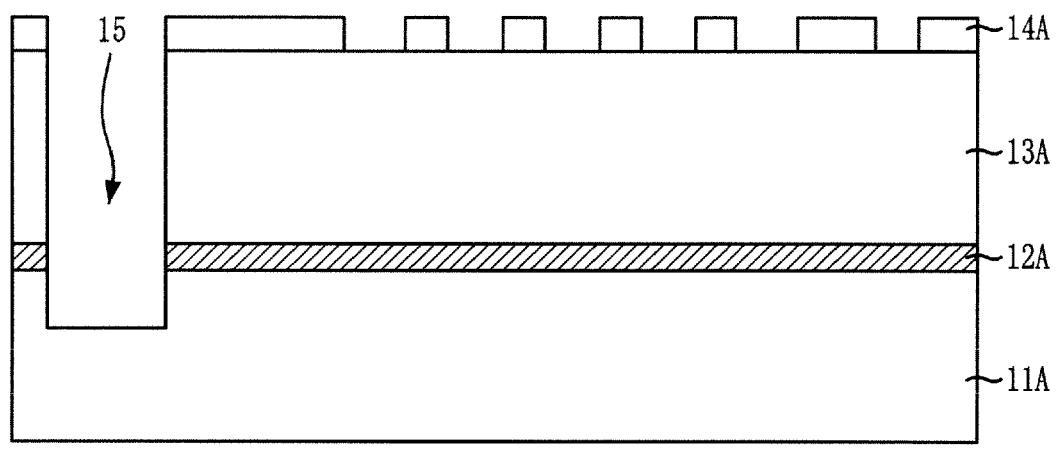

Referring to FIG. 22E, a first trench 15 is formed to a width of about 30 μm to 200 μm by performing a sawing process. The first trench 15 is to define the opening line formed to correspond to the regions where the array pads AP1 to AP8. Reference numerals 11A, 12A, and 13A represent a patterned SOI substrate, a patterned insulation layer, and a first patterned silicon-based layer, respectively. Although the sawing can be performed after the formation of the hard mask 14A as illustrated in FIG. 22E, the sawing can still be performed at the step illustrated in FIG. 22H (i.e., prior to a release process). The sawing process uses a separate alignment mask during the etching, more specifically, the dry etching for forming the hard mask 14A illustrated in FIG. 22D. The first trench 15 can be formed by a dry or wet etching. In this case, the first trench 15 is formed using a separate mask.

Figure 22F:
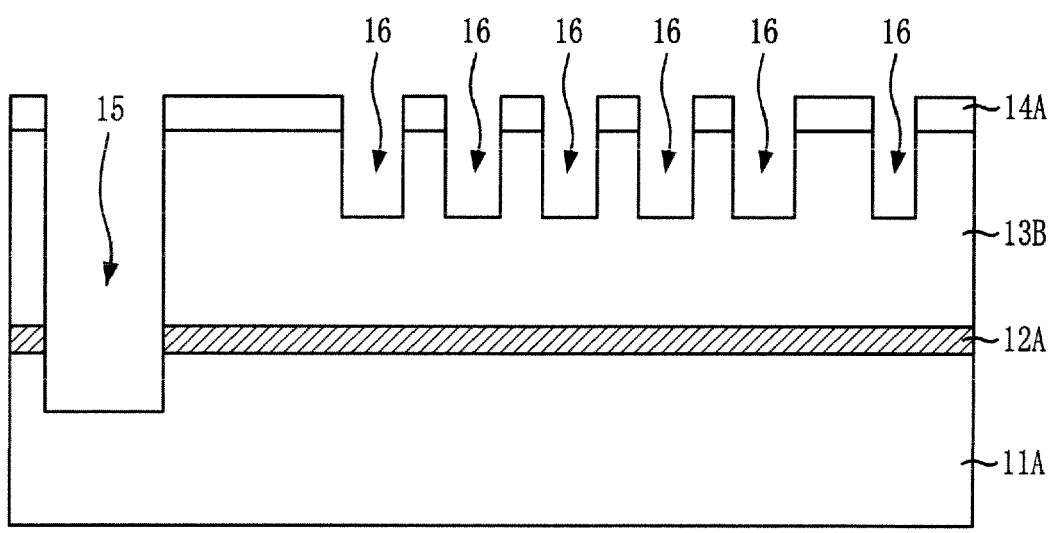

Referring to FIG. 22F, the first patterned silicon-based layer 13A is etched using the hard mask 14A as an etch mask to form a plurality of second trenches 16. The second trenches 16 are used to form a sensor structure, more specifically, the moving part of the MEMS sensor. Reference numeral 13B represents a second patterned silicon-based layer 13B.

Figure 22G:
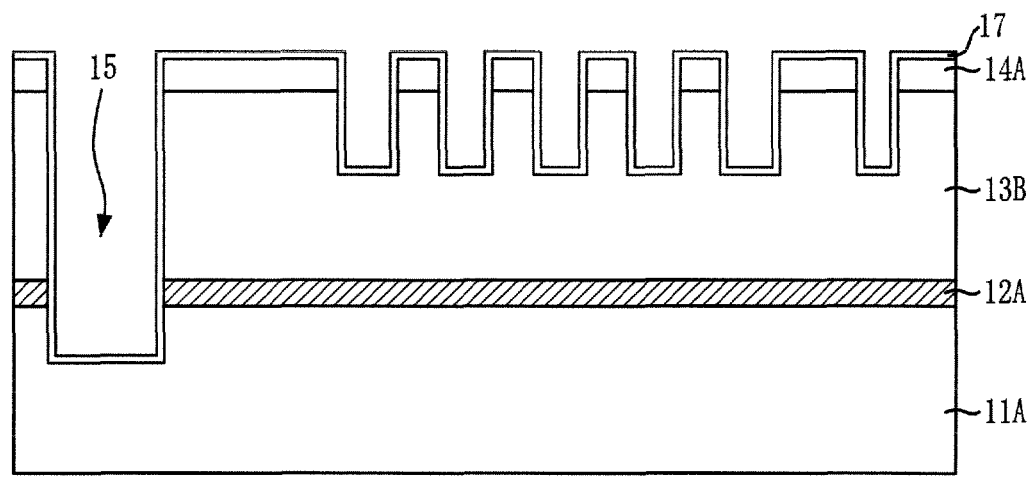
Figure 22H:
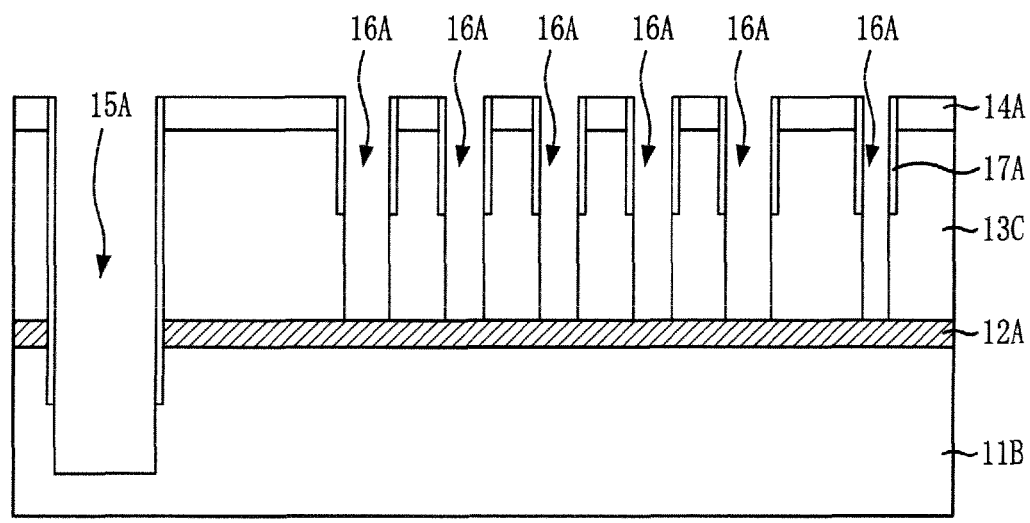

Referring to FIG. 22G, a passivation layer 17 is formed over the resultant structure illustrated in FIG. 22F. Referring to FIG. 22H, a portion of the patterned substrate 11A underneath the first trench 15 is etched to define an opening line 15A. At this time, the second trenches 16 are etched till the upper surface of the patterned insulation layer 12A is exposed. Reference numeral 13C represents a third patterned silicon-based layer. Reference numerals 16A and 17A represent patterned second trenches and a patterned passivation layer, respectively. In particular, the opening line 15A is formed to a depth of about 100 μm to 400 μm. The opening line 15A can be defined by sawing instead of the etching.

Figure 22I:
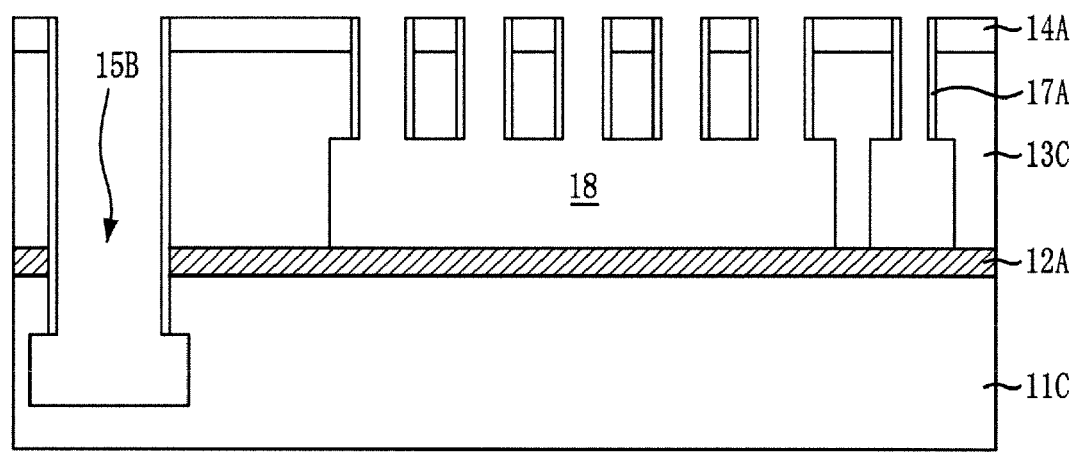
Figure 22J:
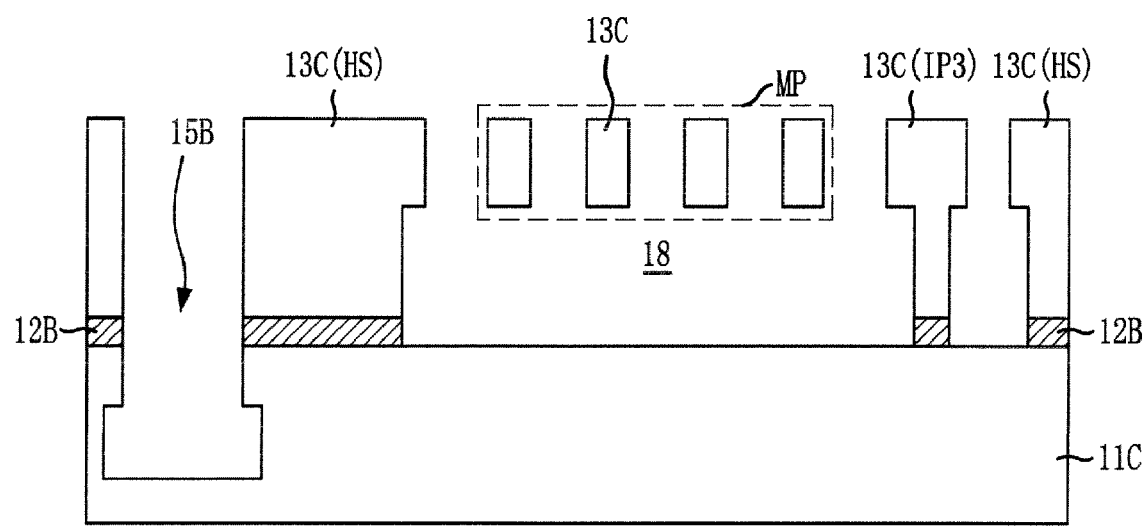

Referring to FIG. 22I, a wet etching process often called 'silicon release process' is performed using the patterned passivation layer 17A as an etch barrier to etch bottom portions of the opening line 15A and the patterned second trenches 16A in a horizontal direction. As a result of the wet etching, the widths of the bottom portions of the opening line 15A and the patterned second trenches 16A are extended and simultaneously, a moving part MP (see FIG. 22J) is formed. Reference numerals 11C, 15B and 18 represent a resultant SOI substrate, an extended opening line and cavities obtained after the wet etching. Referring to FIG. 22J, the hard mask 14A and the patterned passivation layer 17A are removed to form the moving part MP and a plurality of inner pads IP1 to IP8.

Although not illustrated, a bonding promoter that enhances the bonding may be formed over the MEMS sensor wafer to adjust the bonding intensity and reactability between the silicon-based layer of the first substrate 200 and the bonding bumps BB1 to BB8. The bonding promoter includes a material that reacts with a material for the bonding bumps BB1 to BB8. For instance, the bonding promoter material may include a metal-based material such as TiW/Au, Ti/Al, Ti/TiN/Al, and TiN/Al. Also, during the formation of the bonding promoter, a sputtering method that does not provide good step coverage is used to prevent an incidence of electric short circuit between the electrode and the body of the wafer. The cap wafer is fabricated under the state in which an upper portion of the cap wafer is planarized. Thus, when the bonding promoter is formed over the cap wafer, an incidence of electric short circuit is likely to occur.

Figure 23A:
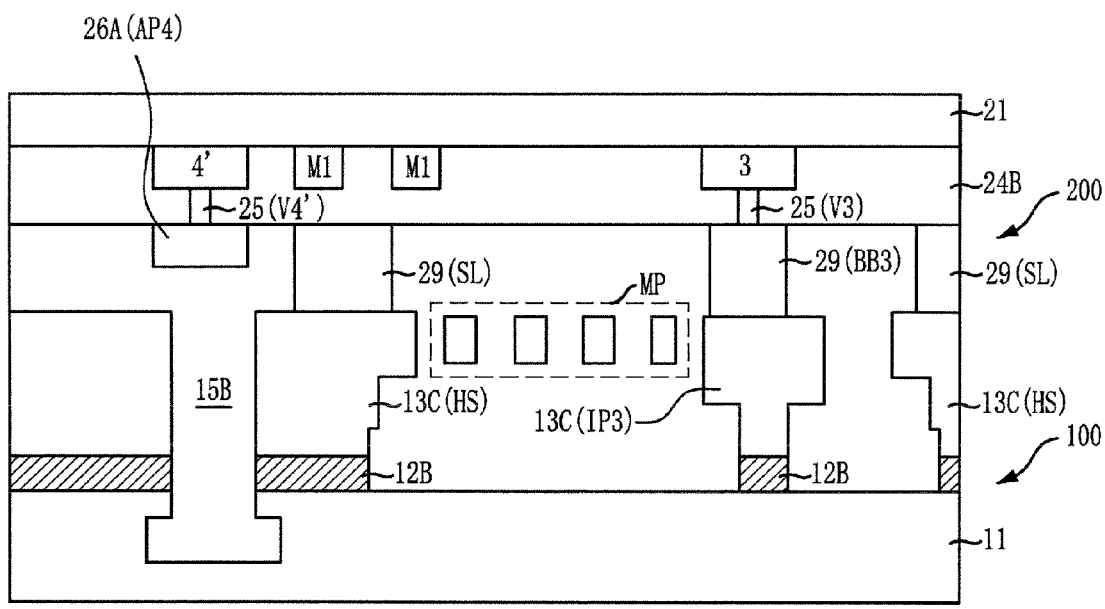
FIGS. 23A to 23D illustrate cross-sectional views of structures associated with 'S57' to 'S59' illustrated in FIG. 5.

A packaging method will proceed as follows. As illustrated in FIGS. 5 and 23A, at step S57, the resultant substrate structures including the first substrate 200 and the second substrate 100 provided through the respective cap wafer and MEMS sensor fabrication processes are arranged to face each other and bonded together. The first substrate 200 and the second substrate 100 are aligned with each other in an image projection type, and then bonded together.

Figure 23B:
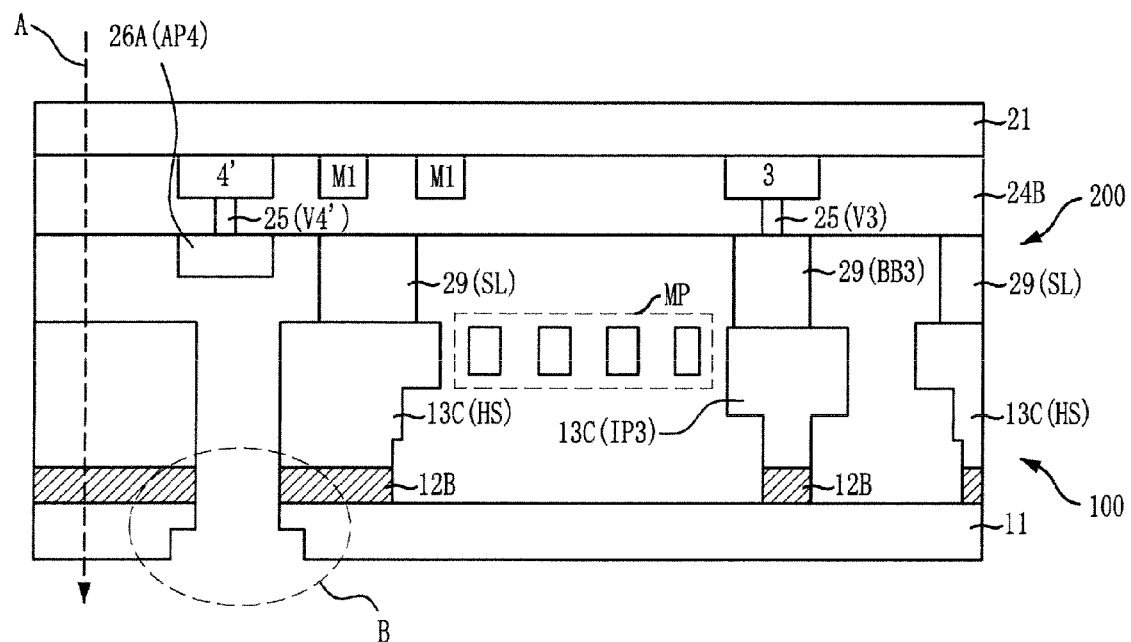

Referring to FIG. 23B, at step S58, a rear surface of the second substrate 100 is ground. As reference letter 'B' indicates, the extended opening line 15B (see FIG. 23A) is opened to expose the array pads AP1 to AP8 of the first substrate 200. The back-grinding can be performed on the first substrate 200 to make the total thickness of the chip as small as possible. In such a case, the back-grinding is performed on the first substrate 200 to decrease the thickness of the chip to a certain extent. Afterwards, another back-grinding is performed on the second substrate 100 to decrease the rest thickness of the chip.

Figure 23C:
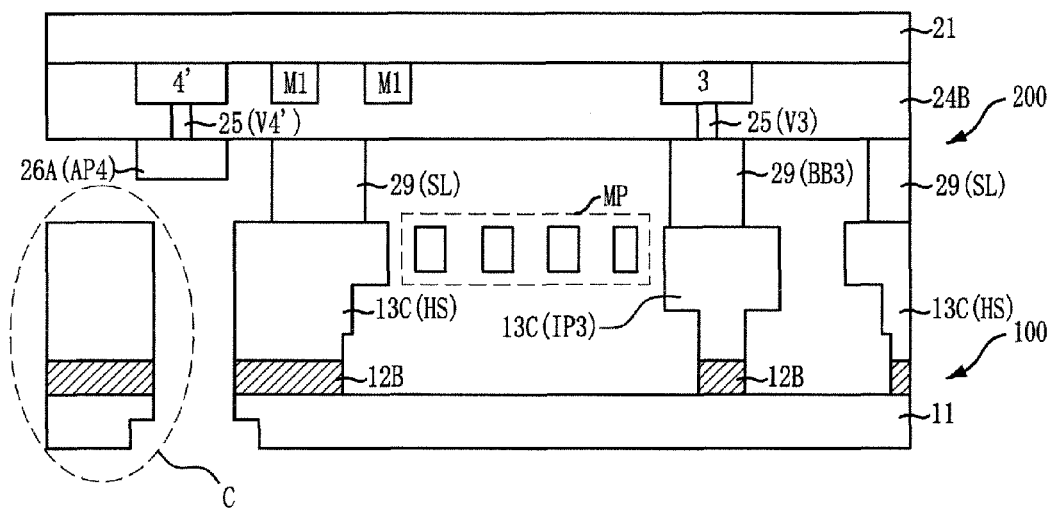

Referring to FIG. 23C, at S59, the first substrate 200 and the second substrate 100 are diced. Reference letter 'A' in FIG. 23B represents a region at which the dicing proceeds, and a portion indicated by reference letter 'C' in FIG. 23C is removed by the dicing.

Figure 23D:
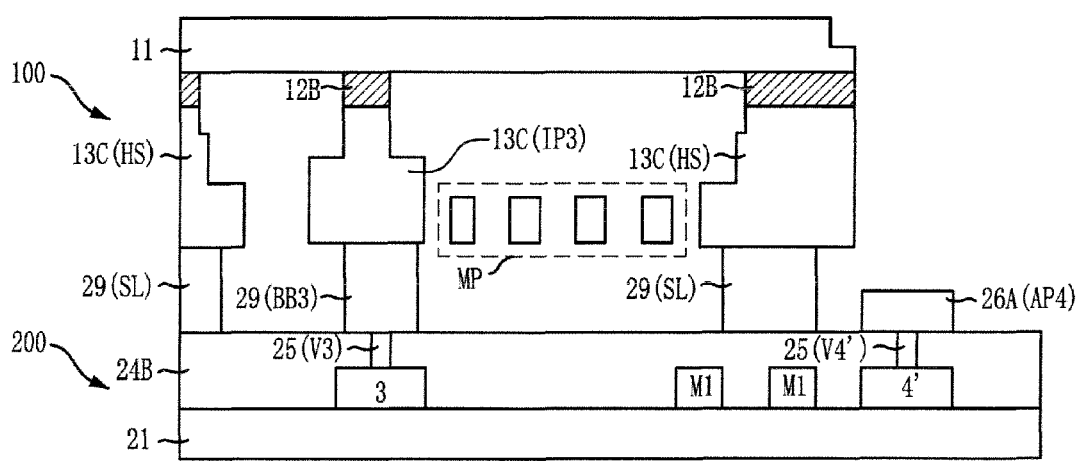

Referring to FIG. 23D, at step S60, the chip is rotated by about 180 degrees to place the first substrate 200 on the top and the second substrate 100 at the bottom. A wire bonding is performed using gold (Au) on the array pads AP1 to AP8 that are not covered by the second substrate 100. A packaging is performed on the resultant structure obtained after the wire bonding.

According to various embodiments of the present invention, the inner pads, the outer pads, and the inner interconnection lines are formed using a method of forming metal interconnection lines (e.g., Al metal interconnection lines) in a multiple-layer structure. As a result, variation in the height of the bonding bumps, which often occurs when the metal interconnection lines are formed from deep via holes, can be reduced. This reduction contributes to an improvement on yields of the bonding.

According to the embodiments of the present invention, the inner pads, the outer pads, and the inner interconnection lines are formed as bottom interconnection lines by performing dual layer metallization (DLM) on the cap wafer. Top interconnection lines that are electrically coupled to respective target through via plugs. The top interconnection lines are used as the array pads AP1 to AP8. As a result, it is possible to increase a degree of freedom in an interconnection line layout, allow a hermetic sealing, and standardize the size of a chip.

According to the embodiments of the present invention, a spacer for the moving part of the MEMS sensor is secured based on the height of the bonding bumps, which are used as a bonding material. As a result, an additional process of forming cavities can be omitted, thereby simplifying the entire fabrication process.

According to the embodiments of the present invention, interconnection lines (i.e., the inner and outer pads and the inner interconnection lines) are formed over the flat cap wafer instead of the wafer for the MEMS sensor based on the metal interconnection line formation method. In addition to the interconnection lines, a logic chip fabrication process can proceed with the cap wafer fabrication process. Thus, the high integration of the MEMS sensor can be achieved.

According to the embodiments of the present invention, the trench for forming the opening line is formed over the MEMS sensor wafer by performing a sawing process. The trench is then automatically opened during a back-grinding process, so that the opening line exposing the array pads of the cap wafer is formed. As a result, similar to the conventional packaging method, an additional alignment marking process does not need to be performed over the rear surface of the MEMS sensor wafer.

According to the embodiments of the present invention, the deep trench for forming the opening line is formed in a region of the MEMS sensor wafer corresponding to the array pads of the cap wafer by performing a sawing process. The MEMS sensor wafer is then diced. Accordingly, the damage to the array pads which often occurs during the dicing can be reduced.

While the present invention has been described with respect to various embodiments, it will be apparent to those skilled in the art that various changes and modifications may be made without departing from the spirit and scope of the invention as defined in the following claims.

What is claimed is:

1. A package of a micro-electro-mechanical systems (MEMS) device, the package comprising:
   a cap wafer;
   a plurality of bonding bumps formed over the cap wafer;
   a plurality of array pads arrayed on an outer side of the bonding bumps;
   a sealing line formed between the bonding bumps and the array pads to encompass the bonding bumps; and an MEMS device wafer bonded to an upper portion of the cap wafer in a manner to expose the array pads,
wherein the MEMS device wafer comprises:
a silicon on insulator (SOI) substrate;
an insulation layer formed over the SOI substrate;
a plurality of inner pads formed over the insulation layer;
a plurality of barrier walls separated from the inner pads and bonded to the sealing line; and
a moving part supported by the inner pads.

2. The package of claim 1, wherein the bonding bumps and the sealing line are formed substantially at the same layer level.

3. The package of claim 1, wherein the cap wafer comprises:
a plurality of inner pads;
a plurality of outer pads;
a plurality of inner interconnection lines respectively coupling the inner pads to the outer pads;
an insulation layer covering the inner pads, the outer pads, and the inner interconnection lines;
a plurality of first plugs formed in the insulation layer and respectively coupling the inner pads to the bonding bumps; and
a plurality of second plugs formed in the insulation layer and respectively coupling the outer pads to the array pads.

4. The package of claim 3, wherein the inner pads, the outer pads, and the inner interconnection lines are formed substantially at the same layer level.

5. The package of claim 3, wherein the first plugs and the second plugs are formed substantially at the same layer level.

6. The package of claim 1, wherein the inner pads are bonded to respective ones of the bonding bumps.

7. The package of claim 1, wherein the moving part is formed between the barrier walls.

8. The package of claim 1, wherein the inner pads, the barrier walls, and the moving part each include substantially the same material.

9. The package of claim 8, wherein the inner pads, the barrier walls, and the moving part each include a silicon-based material.

10. The package of claim 1, wherein the cap wafer and the MEMS device wafer are separated to a certain distance by the sealing line and the barrier walls.

11. The package of claim 1, wherein the inner pads are bonded to respective ones of the bonding bumps through a bonding promoter.

12. The package of claim 11, wherein the bonding promoter includes one selected from a TiW/Au structure, a Ti/Al structure, a Ti/TiN/Al structure, and a TiN/Al structure.

13. The package of claim 1, wherein the barrier walls are bonded to the sealing line through a bonding promoter.

14. The package of claim 13, wherein the bonding promoter includes one selected from a TiW/Au structure, a Ti/Al structure, a Ti/TiN/Al structure, and a TiN/Al structure.

15. The package of claim 1, wherein the bonding bumps are formed to have substantially the same height as the sealing line.

16. The package of claim 15, wherein the bonding bumps are formed thicker than the array pads.

17. The package of claim 1, wherein the bonding bumps and the sealing line are formed with an area being about 7% to 35% of the total area of the cap wafer.

* * * * *